(12) United States Patent
Yazawa et al.

(10) Patent No.: US 12,237,194 B2
(45) Date of Patent: Feb. 25, 2025

(54) SUBSTRATE TRANSPORTER AND SUBSTRATE PROCESSING APPARATUS INCLUDING SUBSTRATE TRANSPORTER

(71) Applicant: EBARA CORPORATION, Tokyo (JP)

(72) Inventors: Akihiro Yazawa, Tokyo (JP); Takashi Koba, Tokyo (JP); Kenichi Kobayashi, Tokyo (JP); Kenichi Akazawa, Tokyo (JP); Fong-Jie Du, Tokyo (JP); Makoto Kashiwagi, Tokyo (JP); Asagi Matsugu, Tokyo (JP); Takahiro Nanjo, Tokyo (JP); Hideharu Aoyama, Tokyo (JP); Takashi Mitsuya, Tokyo (JP); Tetsuji Togawa, Tokyo (JP)

(73) Assignee: EBARA CORPORATION, Toyko (JP)

( * ) Notice: Subject to any disclaimer, the term of this patent is extended or adjusted under 35 U.S.C. 154(b) by 1082 days.

(21) Appl. No.: 17/258,916

(22) PCT Filed: Jul. 9, 2019

(86) PCT No.: PCT/JP2019/027067
§ 371 (c)(1),
(2) Date: Sep. 9, 2021

(87) PCT Pub. No.: WO2020/013151
PCT Pub. Date: Jan. 16, 2020

(65) Prior Publication Data
US 2022/0005716 A1   Jan. 6, 2022

(30) Foreign Application Priority Data

Jul. 12, 2018 (JP) ................................ 2018-132231

(51) Int. Cl.
*B24B 37/14* (2012.01)
*B24B 37/26* (2012.01)
(Continued)

(52) U.S. Cl.
CPC ........ *H01L 21/67706* (2013.01); *B24B 37/14* (2013.01); *B24B 37/26* (2013.01);
(Continued)

(58) Field of Classification Search
CPC ........... H01L 21/67219; H01L 21/6776; H01L 21/304; H01L 21/67259; H01L 21/67706;
(Continued)

(56) References Cited

U.S. PATENT DOCUMENTS 7,188,721 B1   3/2007 Wu et al.
2008/0213071 A1*  9/2008 Fritsche ............ H01L 21/67236
414/222.13
(Continued)

FOREIGN PATENT DOCUMENTS

JP   2000-024602 A   1/2000
JP   2003-100581 A   4/2003
(Continued)

OTHER PUBLICATIONS

Machine Translation of JP 2008182256 A to Sugizaki et al. (Year: 2008).*
(Continued)

*Primary Examiner* — Benjamin L Osterhout
(74) *Attorney, Agent, or Firm* — BakerHostetler

(57) ABSTRACT

To provide an automated apparatus for conveying a rectangular substrate. According to one embodiment, there is provided a substrate conveying apparatus for conveying the rectangular substrate. The substrate conveying apparatus includes a plurality of conveyance rollers, a plurality of roller shafts, a motor, and a pusher. The plurality of conveyance rollers are configured to support a lower surface of the substrate. To the plurality of roller shafts, the plurality of conveyance rollers are mounted. The motor is configured to rotate the plurality of roller shafts. The pusher is for lifting (Continued)

the substrate on the plurality of conveyance rollers such that the substrate is separated away from the plurality of conveyance rollers. The pusher includes a stage configured to pass through a clearance between the plurality of roller shafts.

29 Claims, 28 Drawing Sheets

(51) Int. Cl.
    *B24B 37/30*      (2012.01)
    *B65G 13/02*      (2006.01)
    *H01L 21/304*      (2006.01)
    *H01L 21/677*      (2006.01)
    *B24B 41/06*      (2012.01)
    *B24B 57/02*      (2006.01)
    *B65G 39/04*      (2006.01)
    *H01L 21/67*      (2006.01)

(52) U.S. Cl.
    CPC .............. *B24B 37/30* (2013.01); *B65G 13/02* (2013.01); *H01L 21/304* (2013.01); *B24B 41/06* (2013.01); *B24B 57/02* (2013.01); *B65G 39/04* (2013.01); *H01L 21/67034* (2013.01); *H01L 21/67219* (2013.01); *H01L 21/67259* (2013.01); *H01L 21/6776* (2013.01)

(58) Field of Classification Search
    CPC ... H01L 21/67034; B65G 13/02; B65G 39/04; B24B 41/06; B24B 37/26; B24B 37/30; B24B 37/14; B24B 57/02
    See application file for complete search history.

(56) References Cited

U.S. PATENT DOCUMENTS

| | | | |
|---|---|---|---|
| 2012/0031438 A1* | 2/2012 | Jheong | ................ H01L 21/6776 134/32 |
| 2013/0084428 A1* | 4/2013 | Hayashi | ................ C08F 236/12 428/141 |
| 2021/0010148 A1 | 1/2021 | Nishikiuchi | |

FOREIGN PATENT DOCUMENTS

| | | |
|---|---|---|
| JP | 2003-103458 A | 4/2003 |
| JP | 2004-307115 A | 11/2004 |
| JP | 2006-036530 A | 2/2006 |
| JP | 2006-240771 A | 9/2006 |
| JP | 2007-150280 A | 6/2007 |
| JP | 2008-182256 A | 8/2008 |
| JP | 2010-222063 A | 10/2010 |
| JP | 2011-184186 A | 9/2011 |
| JP | 2013-004949 A | 1/2013 |
| JP | 2014-176950 A | 9/2014 |
| WO | WO 2017/141495 A1 | 8/2017 |

OTHER PUBLICATIONS

Machine Translation of JP 20100222063 A to Suganaga et al. (Year: 2010).*
International Patent Application No. PCT/JP2019/027067; Int'l Search Report; dated Aug. 13, 2019; 2 pages.
European Patent Application No. 19834286.7; Extended Search Report; dated Feb. 22, 2022; 8 pages.

* cited by examiner

SUBSTRATE TRANSPORTER AND SUBSTRATE PROCESSING APPARATUS INCLUDING SUBSTRATE TRANSPORTER

TECHNICAL FIELD

This application relates to a substrate transporter and a substrate processing apparatus including the substrate transporter. This application claims priority from Japanese Patent Application No. 2018-132231 filed on Jul. 12, 2018. The entire disclosure including the description, the claims, the drawings, and the abstract in Japanese Patent Application No. 2018-132231 is herein incorporated by reference.

BACKGROUND ART

For manufacturing a semiconductor device, a chemical mechanical polishing (CMP) apparatus is used for flattening a surface of a substrate. The substrate used in manufacturing the semiconductor device is often in a circular plate shape. Not limited to the semiconductor device, there is an increasing request for a flatness when flattening a surface of a rectangular-shaped substrate, such as a Copper Clad Laminate substrate (CCL substrate), a Printed Circuit Board (PCB) substrate, a photomask substrate, and a display panel. There is also an increasing request for flattening a surface of a package substrate on which an electronic device, such as a PCB substrate, is disposed.

CITATION LIST

Patent Literature

PTL 1: Japanese Unexamined Patent Application Publication No. 2003-103458
PTL 2: Japanese Unexamined Patent Application Publication No. 2014-176950

SUMMARY OF INVENTION

Technical Problem

A circular semiconductor substrate has a dimension determined by a standard (for example, the SEMI standard), while the above-described rectangular substrate of the Copper Clad Laminate substrate (CCL substrate), the Printed Circuit Board (PCB) substrate, the photomask substrate, the display panel, and the like has a dimension that is not determined, thus possibly including substrates having various dimensions. In terms of production efficiency of the device, dimensions of the substrate tend to increase. A large and heavy substrate is likely to cause warp and deformation. Thus, a technique similar to that of a conveying apparatus for the conventional circular substrate is not necessarily applicable to the large and heavy substrate. Therefore, one object is to provide an automated device that conveys a rectangular substrate.

Solution to Problem

According to one embodiment, there is provided a substrate conveying apparatus for conveying a rectangular substrate. The substrate conveying apparatus includes a plurality of conveyance rollers, a plurality of roller shafts, a motor, and a pusher. The plurality of conveyance rollers are configured to support a lower surface of the substrate. To the plurality of roller shafts, the plurality of conveyance rollers are mounted. The motor is configured to rotate the plurality of roller shafts. The pusher is for lifting the substrate on the plurality of conveyance rollers such that the substrate is separated away from the plurality of conveyance rollers. The pusher includes a stage configured to pass through a clearance between the plurality of roller shafts.

DESCRIPTION OF EMBODIMENTS

Figure 1:
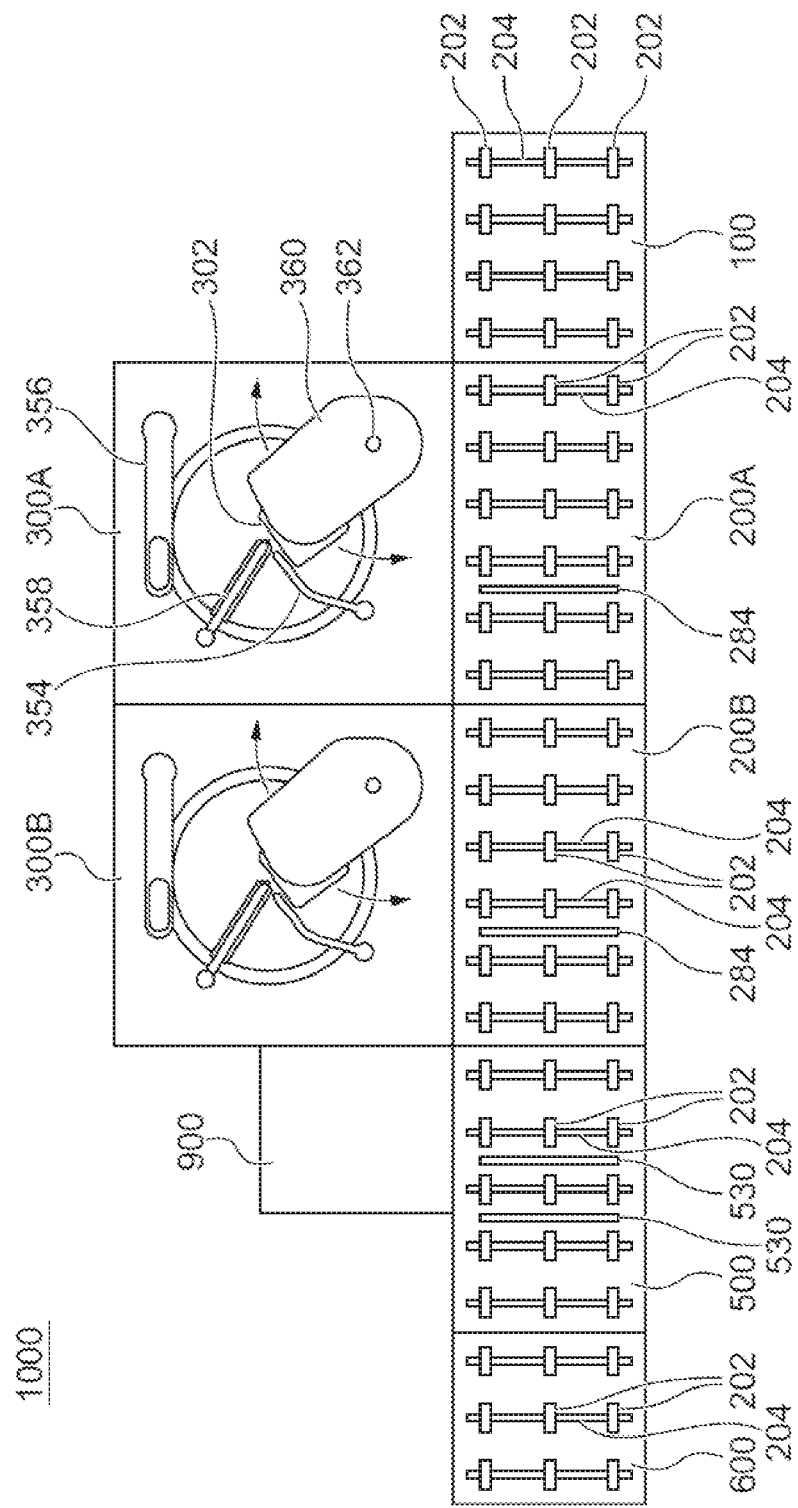
FIG. 1 is a plan view illustrating an overall configuration of a substrate processing apparatus according to one embodiment.

The following will describe embodiments of a substrate conveying apparatus and a substrate processing apparatus including the substrate conveying apparatus according to the present invention with the attached drawings. In the attached drawings, identical or similar reference numerals are attached to identical or similar components, and overlapping description regarding the identical or similar components may be omitted in the description of the respective embodiments. Features illustrated in the respective embodiments are applicable to other embodiments in so far as they are consistent with one another.

FIG. 1 is a plan view illustrating an overall configuration of a substrate processing apparatus 1000 according to one embodiment. The substrate processing apparatus 1000 illustrated in FIG. 1 includes a loading unit 100, a conveyance unit 200, a polishing unit 300, a drying unit 500, and an unloading unit 600. In the illustrated embodiment, the conveyance unit 200 includes two conveyance units 200A and 200B, and the polishing unit 300 includes two polishing units 300A and 300B. In one embodiment, these units can be each independently formed. Independently forming these units ensures easily forming the substrate processing apparatus 1000 in a different configuration by conveniently combining the number of respective units. The substrate processing apparatus 1000 includes a controller 900, and each configuration member of the substrate processing apparatus 1000 is controlled by the controller 900. In one embodiment, the controller 900 can be configured of a general computer that includes, for example, an input/output device, an arithmetic device, and a storage device.

<Loading Unit>

Figure 2:
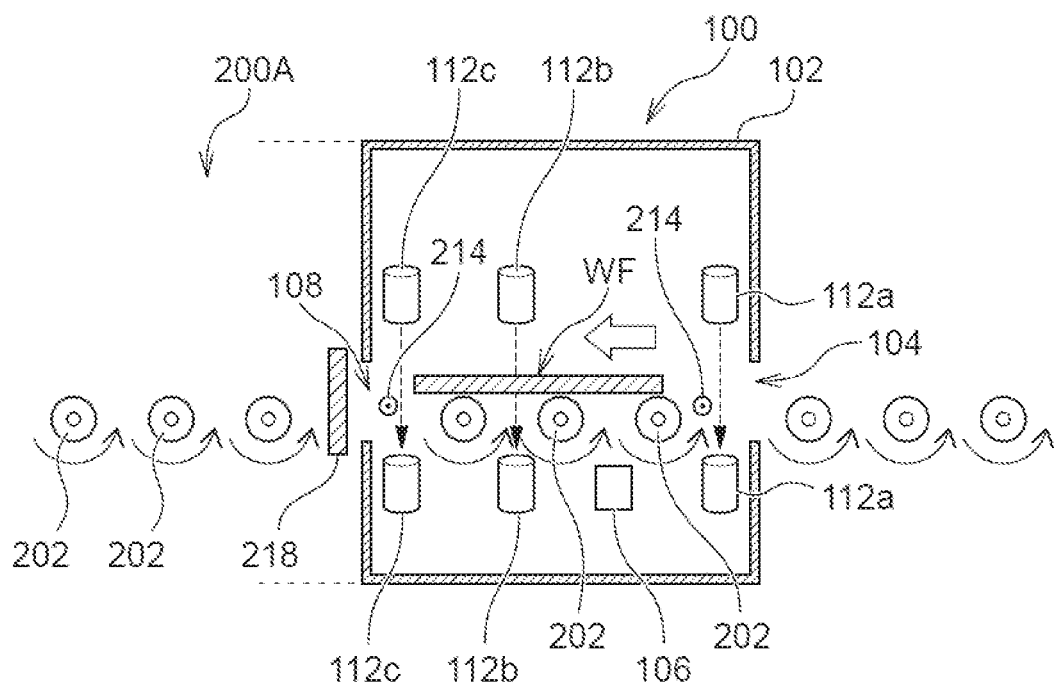
FIG. 2 is a side view schematically illustrating a loading unit according to one embodiment.

The loading unit 100 is a unit that introduces a substrate WF before processes, such as polishing and cleaning, are performed into the substrate processing apparatus 1000. FIG. 2 is a side view schematically illustrating the loading unit 100 according to one embodiment. In one embodiment, the loading unit 100 includes a housing 102. The housing 102 has an inlet opening 104 on a side from which the substrate WF is received. In the embodiment illustrated in FIG. 2, the right side is the inlet side. The loading unit 100 receives the substrate WF as a process target from the inlet opening 104. The loading unit 100 has an upstream (the right side in FIG. 2) where a processing apparatus is arranged. The processing apparatus is where treatment processes before the process of the substrate WF by the substrate processing apparatus 1000 according to the disclosure is performed. In the embodiment illustrated in FIG. 2, the loading unit 100 includes an ID reader 106. The ID reader 106 reads an ID of the substrate received from the inlet opening 104. The substrate processing apparatus 1000 performs various processes on the substrate WF according to the read ID. In one embodiment, the ID reader 106 is not necessarily disposed. In one embodiment, the loading unit 1000 is configured so as to be compliant to a mechanical equipment interface standard (IPC-SMEMA-9851) of Surface Mount Equipment Manufacturers Association (SMEMA).

In the embodiment illustrated in FIG. 2, the loading unit 100 includes a plurality of conveyance rollers 202 for conveying the substrate WF. Rotating the conveyance rollers 202 ensures conveying the substrate WF on the conveyance rollers 202 in a predetermined direction (the left direction in FIG. 2). In the illustrated embodiment, the housing 102 of the loading unit 100 has an outlet opening 108 of the substrate WF. The loading unit 100 includes sensors 112 for sensing presence or absence of the substrate WF at a predetermined position on the conveyance rollers 202. The sensor 112 can be a sensor of any form, for example, can be an optical sensor. In the embodiment illustrated in FIG. 2, the three sensors 112 are disposed in the housing 102. One is a sensor 112a disposed in the proximity of the inlet opening 104, one is a sensor 112b disposed in the proximity of the center of the loading unit 100, and the other one is a sensor 112c disposed in the proximity of the outlet opening 108. In one embodiment, according to the detection of the substrate WF by these sensors 112, an operation of the loading unit 100 can be controlled. For example, when the sensor 112a near the inlet opening 104 detects the presence of the substrate WF, the conveyance roller 202 inside the loading unit 100 may start to rotate, or a rotation speed of the conveyance roller 202 may be changed. When the sensor 112c near the outlet opening 108 detects the presence of the substrate WF, an inlet shutter 218 of the conveyance unit 200A, which is a subsequent unit, may open.

Figure 3:
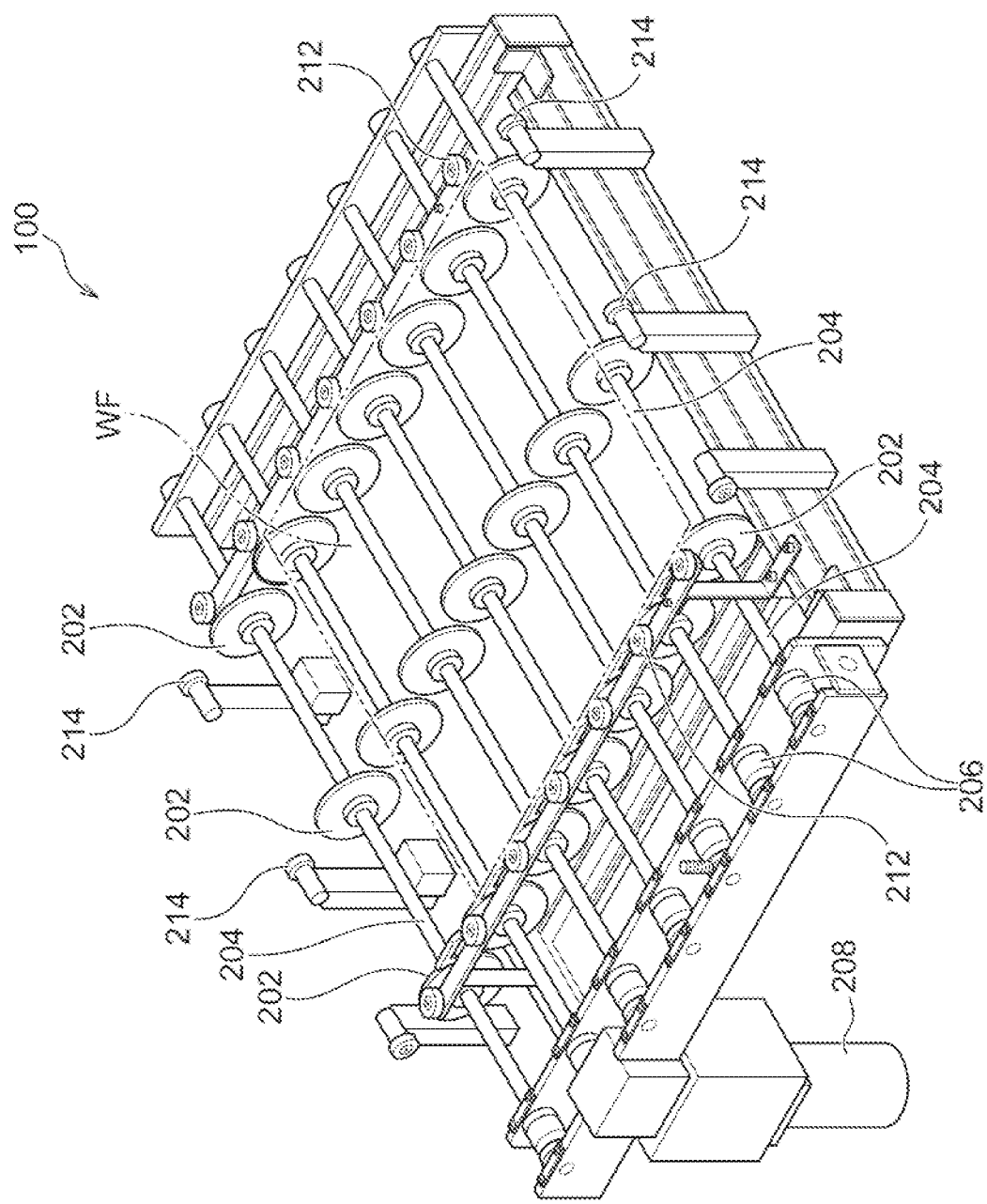
FIG. 3 is a perspective view illustrating a conveying mechanism in the loading unit according to one embodiment.

FIG. 3 is a perspective view illustrating a conveying mechanism in the loading unit 100 according to one embodiment. In the illustrated embodiment, the conveying mechanism of the loading unit 100 includes the plurality of conveyance rollers 202 and a plurality of roller shafts 204 on which the conveyance rollers 202 are mounted. In the illustrated embodiment, the three conveyance rollers 202 are mounted on each of the roller shafts 204. The substrate WF is disposed on the conveyance rollers 202, and the rotation of the conveyance rollers 202 conveys the substrate WF. Installation positions of the conveyance rollers 202 on the roller shaft 204 can be anywhere as long as the substrate WF can be stably conveyed with the positions. However, since the conveyance rollers 202 are brought into contact with the substrate WF, the conveyance rollers 202 should be disposed so as to be in contact with a region without any problem of contacting the substrate WF as the process target. In one embodiment, the conveyance rollers 202 of the loading unit 100 can be made of a conductive polymer. In one embodiment, the conveyance rollers 202 are electrically grounded via the roller shafts 204 and the like. This is for preventing the substrate WF from being charged to cause a damage in the substrate WF. In one embodiment, the loading unit 100 may include an ionizer (not illustrated) to prevent the substrate WT from being charged.

Figure 4:
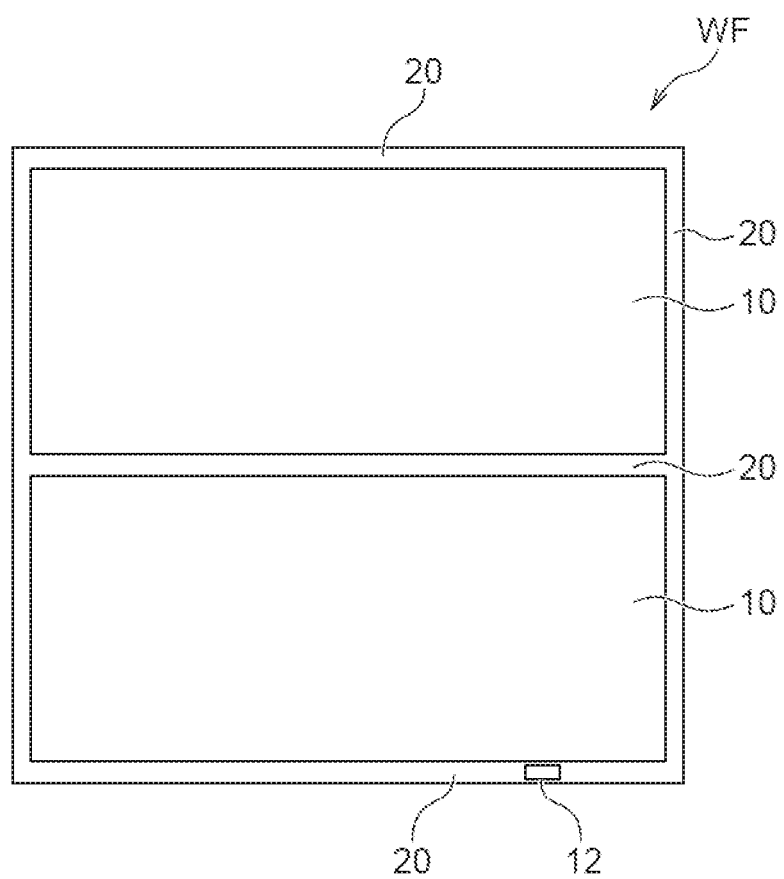
FIG. 4 is a plan view schematically illustrating a substrate as a process target according to one embodiment.

FIG. 4 is a plan view schematically illustrating the substrate WF as the process target according to one embodiment. As illustrated in FIG. 4, in one embodiment, the substrate WF is a thin plate-shaped substrate having a substantially rectangular shape (including a square shape). The substrate WF illustrated in FIG. 4 includes pattern areas 10 and non-pattern areas 20. The "pattern area" is an area including a wiring, a functional chip, and the like, is an area used as a device formed on the substrate, and includes a wiring, a functional chip, and the like significant for the function of the device. Additionally, the "non-pattern area" is an area not used as the device on the substrate. In the embodiment illustrated in FIG. 4, the substrate WF includes the two pattern areas 10 each surrounded by the non-pattern area 20. In one embodiment, the substrate WF can include ID information of the substrate WF in the non-pattern area 20, and, for example, can include an ID tag 12 or the like. The ID of the substrate WF is readable by the above-described ID reader 106.

The loading unit 100 illustrated in FIG. 2 and FIG. 3 receives the substrate WF such that the surface in which the pattern areas 10 are formed of the substrate WF illustrated in FIG. 4 becomes the lower surface and conveys the substrate WF. Therefore, the conveyance rollers 202 are disposed so as to be in contact only with the non-pattern areas 20 in the substrate WF. Specifically, as illustrated in FIG. 3, the conveyance rollers 202 are disposed at positions in contact with the non-pattern areas 20 in the end portion of the substrate WF and positions in contact with the non-pattern area 20 at the center of the substrate WF. The position of the conveyance roller 202 is changeable according to the substrate WF as the process target. Therefore, according to the illustrated embodiment, changing the installation position of the conveyance roller 202 to the roller shaft 204 allows usage for conveyance of the substrate WF having different dimensions and different patterns. Since the dimensions of a rectangular substrate are not determined by a standard like a circular semiconductor substrate, the conveying mechanism according to the embodiment of this disclosure is advantageous in that a slight change allows conveying substrates having various dimensions.

In the embodiment illustrated in FIG. 3, the roller shafts 204 are rotatably driven by a motor 208 via gears 206. In one embodiment, the motor 208 can be a servomotor. The use of the servomotor allows controlling rotation speeds of the roller shafts 204 and the conveyance rollers 202, that is, a conveyance speed of the substrate WF. In one embodiment, the gear 206 can be a magnet gear. Since the magnet gear is a contactless power transmission mechanism, microparticles due to abrasion are not generated as in a contact type gear and eliminates the need for maintenance, such as refueling.

Figure 5:
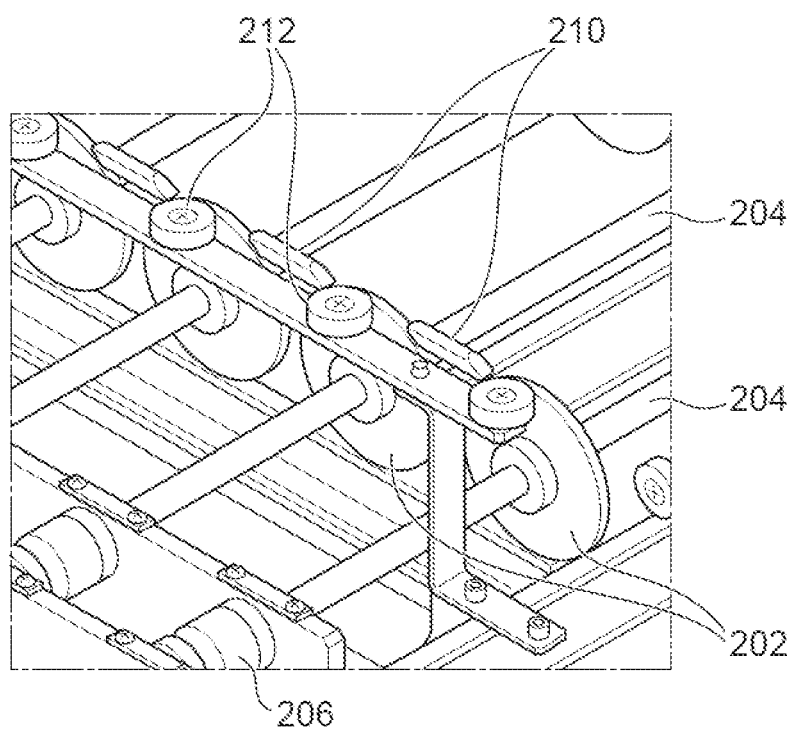
FIG. 5 is a drawing illustrating a vicinity of conveyance rollers illustrated in FIG. 3 in an enlarged manner.

FIG. 5 is a drawing of a vicinity of the conveyance rollers 202 illustrated in FIG. 3 in an enlarged manner. As illustrated in FIG. 5, supporting members 210 are disposed between the conveyance rollers 202 adjacent in the conveying direction. The supporting member 210 prevents the substrate WF conveyed by the conveyance rollers 202 from getting into a clearance between the conveyance rollers 202. The supporting member 210 is disposed at a position somewhat lower than the height of the surface of the conveyance roller 202 in contact with the substrate WF.

As illustrated in FIG. 3 and FIG. 5, a plurality of guide rollers 212 that support the substrate WF in a width direction of the conveyed substrate WF are disposed. The width direction is a direction perpendicular to the conveying direction of the substrate WF and parallel to the surface of the substrate WF. As illustrated in FIG. 3, the guide rollers 212 are configured to support side surfaces of the substrate WF during conveyance. The position of the guide roller 212 is changeable according to the dimensions of the conveyed substrate WF. The illustrated guide rollers 212 are not connected to a power source and are freely rotatable. In one embodiment, the position of the guide roller 212 is changeable according to the width of the conveyed substrate WF.

As illustrated in FIG. 2 and FIG. 3, the loading unit 100 includes auxiliary rollers 214 in the proximity of the inlet opening 104 and the outlet opening 108. The auxiliary rollers 214 are disposed at a height approximately identical to that of the conveyance rollers 202. The position of the auxiliary roller 214 is changeable according to the dimensions of the conveyed substrate WF. The auxiliary rollers 214 support the substrate WF such that the substrate WF during conveyance does not fall between the unit and another unit. The auxiliary rollers 214 are not connected to a power source and are freely rotatable.

In one embodiment, the loading unit 100 may include a reversing machine (not illustrated) that reverses the received substrate WF. In the illustrated embodiment, the loading unit 100 receives the substrate WF such that the surface in which the pattern areas 10 are formed of the substrate WF becomes the lower surface and conveys the substrate WF. However, due to a specification of an upstream processing device, when the substrate WF is conveyed to the loading unit 100 such that the surface in which the pattern areas 10 are formed of the substrate WF becomes the top surface, the reversing machine may reverse the substrate WF such that the surface in which the pattern areas 10 are formed of the substrate WF becomes the lower surface and then the substrate processing apparatus 1000 may perform the subsequent processes.

<Conveyance Unit>

Figure 6:
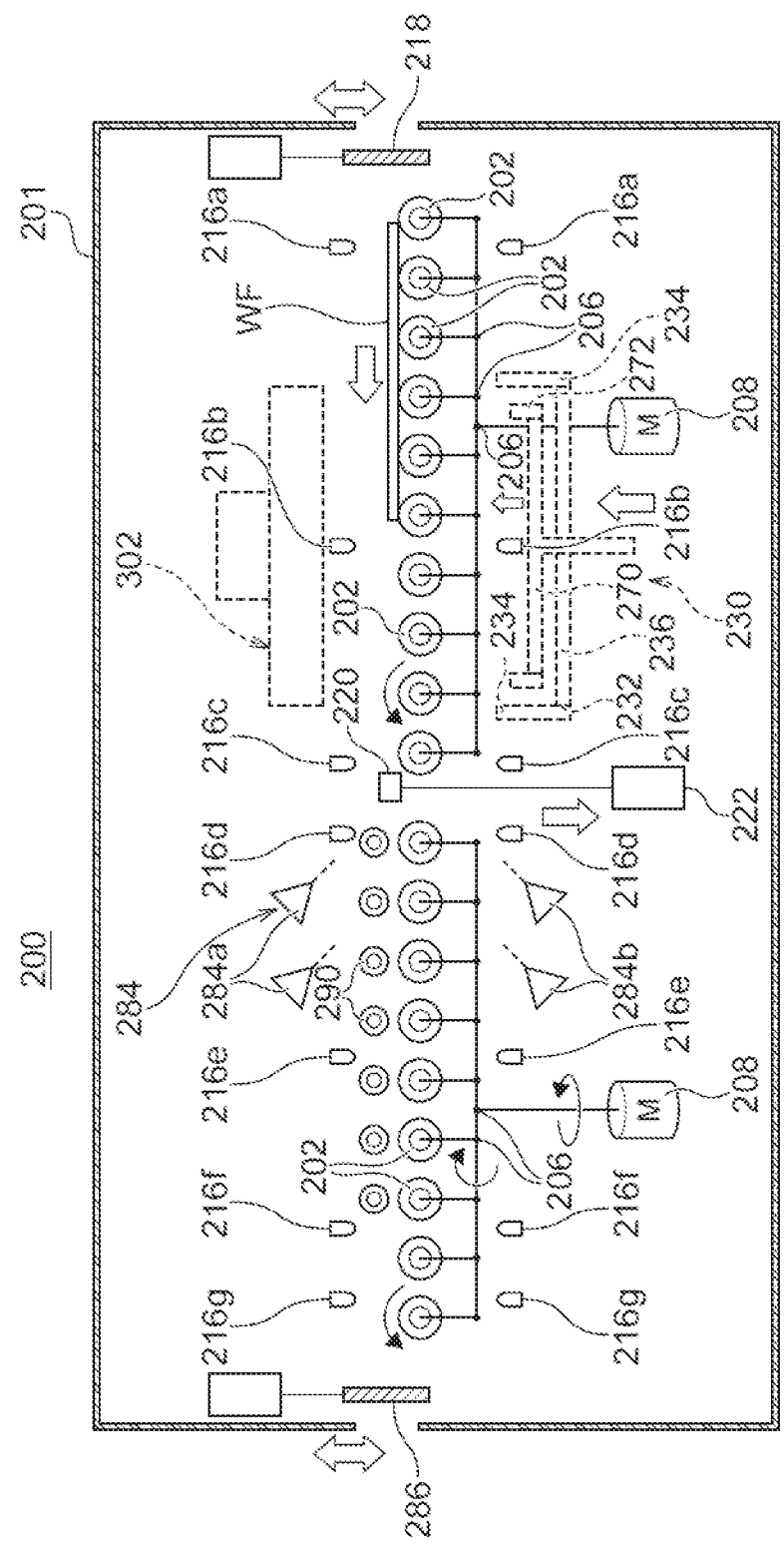
FIG. 6 is a side view schematically illustrating a conveyance unit according to one embodiment.

FIG. 6 is a side view schematically illustrating the conveyance unit 200 according to one embodiment. The substrate processing apparatus 1000 illustrated in FIG. 1 includes the two conveyance units 200A and 200B. Since the two conveyance units 200A and 200B can have identical configurations, the following will collectively give a description as the conveyance unit 200.

Figure 7:
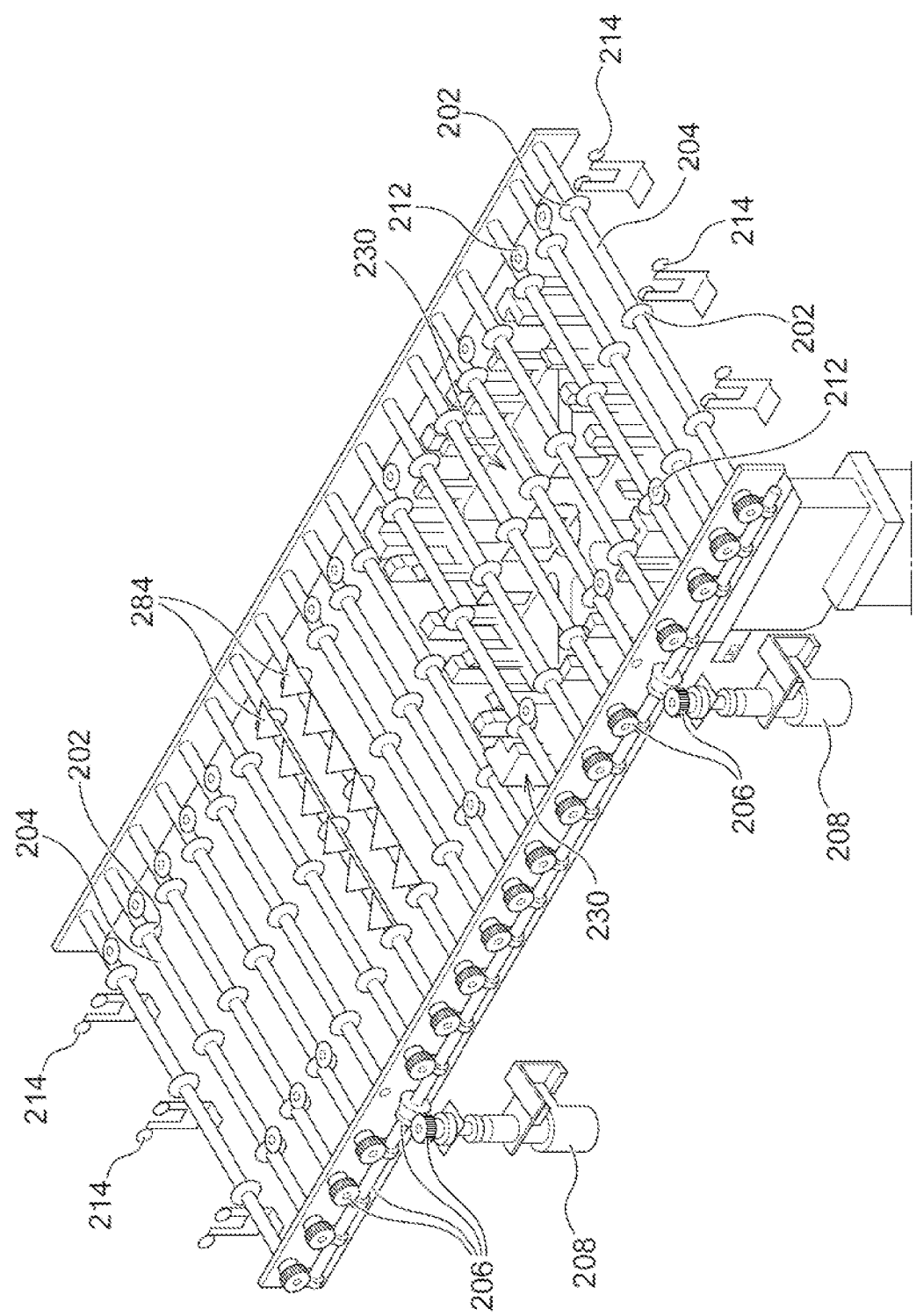
FIG. 7 is a perspective view illustrating the conveyance unit according to one embodiment.

FIG. 7 is a perspective view illustrating the conveyance unit 200 according to one embodiment. The illustrated conveyance unit 200 includes the plurality of conveyance rollers 202 for conveying the substrate WE. Rotating the conveyance rollers 202 ensures conveying the substrate WF on the conveyance rollers 202 in a predetermined direction. The conveyance rollers 202 of the conveyance unit 200 may be made of a conductive polymer or may be made of a polymer without a conductive property. Similarly to the above-described conveying mechanism of the loading unit 100, the conveyance rollers 202 are mounted on the roller shafts 204, and are driven by the motor 208 via the gears 206. In one embodiment, while the motor 208 can be a servomotor and the gear 206 can be a toothed wheel type, the gear 206 can also be a magnet gear similarly to that of the loading unit 100. Similarly to the loading unit 100, the illustrated conveyance unit 200 includes the guide rollers 212 that support the side surfaces of the substrate WF during conveyance. The illustrated conveyance unit 200 includes sensors 216 that detect presence or absence of the substrate WF at a predetermined position on the conveyance rollers 202. The sensor 216 can be a sensor of any form, for example, can be an optical sensor. In the embodiment illustrated in FIG. 6, the seven sensors 216 (216a to 216g) are disposed in the conveyance unit 200. In one embodiment, according to the detection of the substrate WF by these sensors 216a to 216g, the operation of the conveyance unit 200 can be controlled. Positions and roles of the respective sensors 216a to 216g will be described later. As illustrated in FIG. 6, the conveyance unit 200 includes the openable/closable inlet shutter 218 for receiving the substrate WF in the conveyance unit 200. In one embodiment, similarly to the loading unit 100, the conveyance unit 200 includes the supporting members 210 (not illustrated in FIG. 7) that prevent the substrate WF from getting into a clearance between the conveyance rollers 202 adjacent in the conveying direction and the plurality of guide rollers 212 (illustrated in FIG. 7) that support the substrate WF on both sides in the width direction of the conveyed substrate WF.

As illustrated in FIG. 6, the conveyance unit 200 includes a stopper 220. The stopper 220 is connected to a stopper moving mechanism 222, and the stopper 220 can enter inside a conveyance path of the substrate WF that moves on the conveyance rollers 202. When the stopper 220 is positioned within the conveyance path of the substrate WF, the side surface of the substrate WF that moves on the conveyance rollers 202 is brought into contact with the stopper 220 to ensure stopping the substrate WF on the move at the position of the stopper 220. When the stopper 220 is at a position retreated from the conveyance path of the substrate WF, the substrate WF can move on the conveyance rollers 202. The stop position of the substrate WF by the stopper 220 is a position where a pusher 230 described later can receive the substrate WF on the conveyance rollers 202 (a substrate delivery position).

As illustrated in FIG. 6 and FIG. 7, the conveyance unit 200 includes the pusher 230. The pusher 230 is configured to lift the substrate WF on the plurality of conveyance rollers 202 so as to be separated from the plurality of conveyance rollers 202. The pusher 230 is configured to hand over the substrate WF that is held to the conveyance rollers 202 of the conveyance unit 200.

Figure 8:
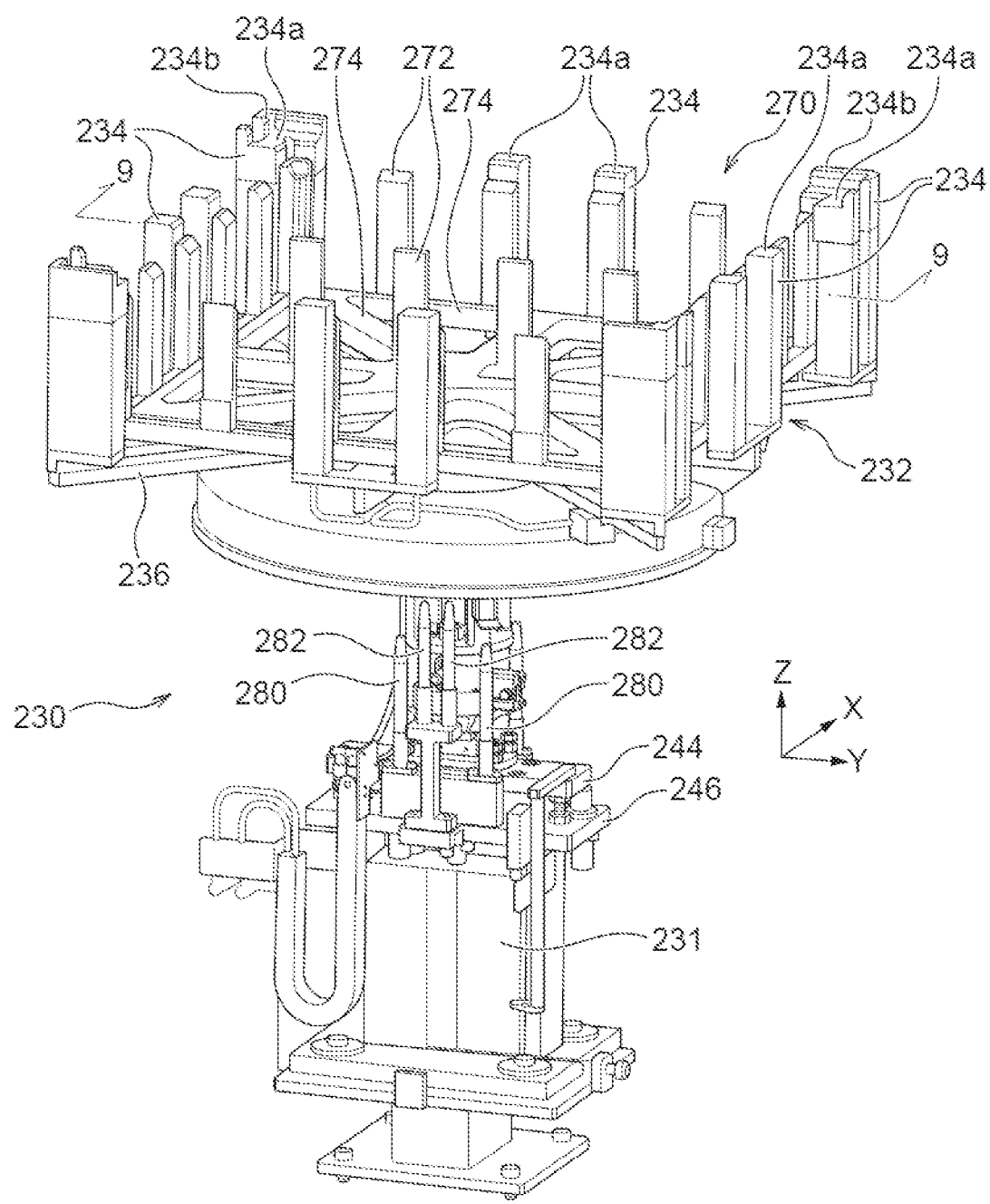
FIG. 8 is a perspective view illustrating a pusher according to one embodiment.
Figure 9:
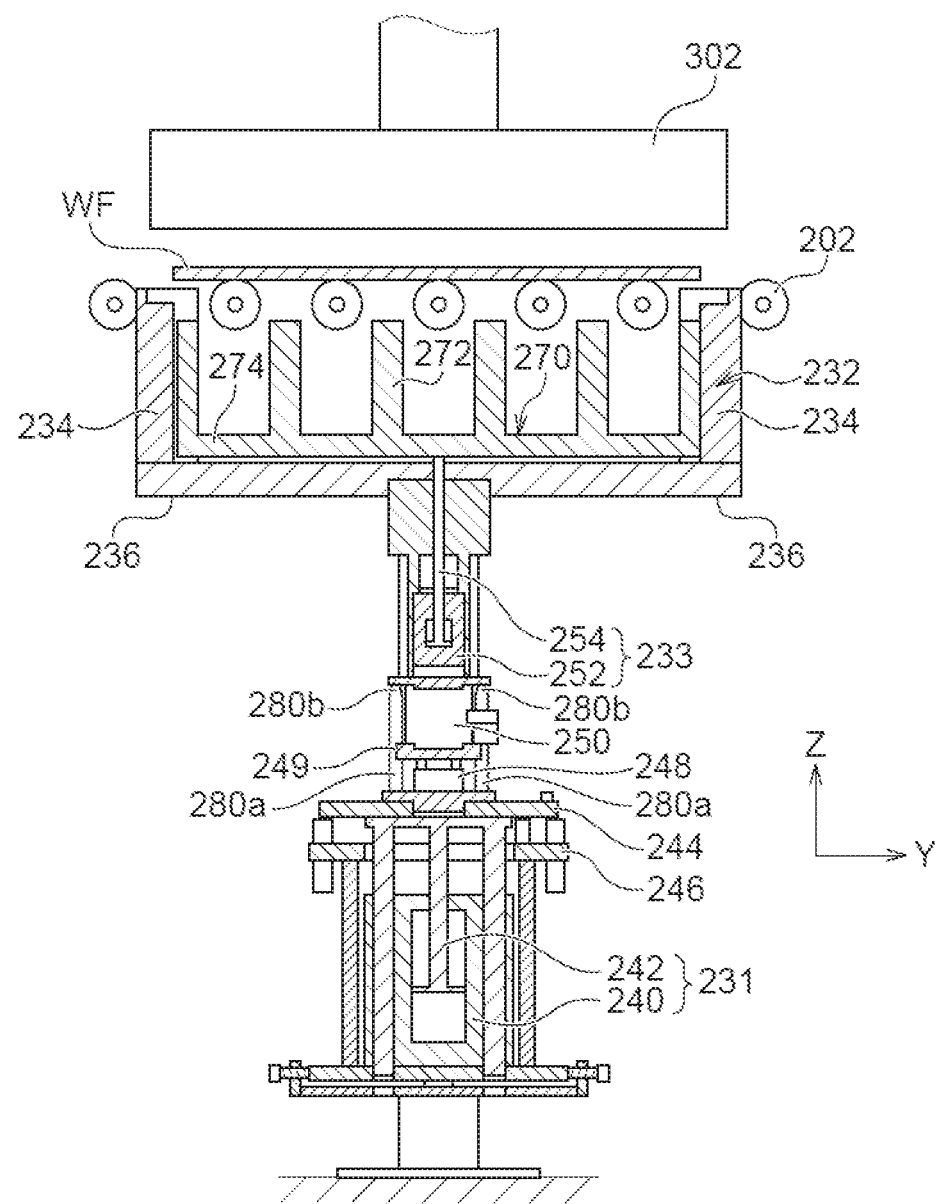
FIG. 9 is a partial cross-sectional view viewing the pusher illustrated in FIG. 8 in the direction of the arrow 9.
Figure 10:
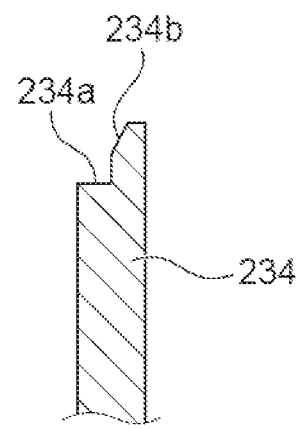
FIG. 10 is a side view illustrating one support pillar of a first stage according to one embodiment.
Figure 11:
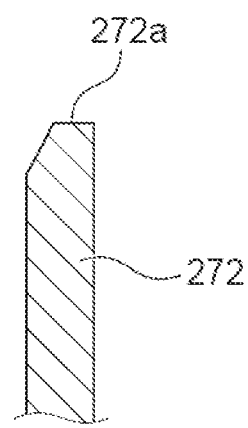
FIG. 11 is a side view illustrating one support pillar of a second stage according to one embodiment.

FIG. 8 is a perspective view illustrating the pusher 230 according to one embodiment. FIG. 9 is a partial cross-sectional view viewing the pusher 230 illustrated in FIG. 8 in the direction of the arrow 9. FIG. 9 schematically illustrates the conveyance rollers 202, the substrate WF disposed at the substrate delivery position on the conveyance rollers 202 together with the pusher 230, and atop ring 302 that receives the substrate WF. In the embodiment illustrated in FIG. 8 and FIG. 9, the pusher 230 includes a first stage 232 and a second stage 270. The first stage 232 is a stage that supports a retainer member 308 of the top ring 302 when the substrate WF is handed over to the top ring 302 described later from the pusher 230. The first stage 232 includes a plurality of support pillars 234. FIG. 10 is a side view illustrating one support pillar of the first stage 232 according to one embodiment. As illustrated in FIG. 10, the support pillar 234 has one end portion including a flat support surface 234a that supports the retainer member 308 of the top ring 302 and an inclined surface 234b that guides the top ring 302. In one embodiment, among the plurality of support pillars 234, the support pillars 234 at the four corner portions may include the support surfaces 234a and the inclined surfaces 234b as illustrated in FIG. 10. A depressed portion formed by the support pillars 234 at the four corner portions can align the retainer member 308. The support pillars 234 other than the support pillars 234 at the four corner portions may include only the support surfaces 234a. The respective support pillars 234 have the other end portions connected to a common base 236. The support pillars 234 are each disposed at a position not interfering with the conveyance roller 202, and in the embodiment illustrated in FIG. 9, the support pillars 234 are each disposed between the conveyance rollers 202. The second stage 270 receives the substrate WF on the conveyance rollers 202. The second stage 270 includes a plurality of support pillars 272. FIG. 11 is a side view illustrating one support pillar 272 of the second stage 270 according to one embodiment. As illustrated in FIG. 11, the support pillar 272 has one end portion including a flat support surface 272a that supports the substrate WF. The respective support pillars 272 have the other end portions connected to a common base 274. The support pillars 272 are each disposed at a position not interfering with the conveyance roller 202, and in the embodiment illustrated in FIG. 9, the support pillars 272 are each disposed between the conveyance rollers 202. The respective support pillars 272 are disposed to support the non-pattern areas 20 in the substrate WF. As details will be described later, the first stage 232 and the second stage 270 are each connected to an elevating mechanism and are each movable in a height direction (z-direction).

The first stage 232 is configured to be movable in the height direction (z-direction). In one embodiment, the pusher 230 includes a first elevating mechanism 231. In one embodiment, as illustrated in FIG. 8 and FIG. 9, the first elevating mechanism 231 of the pusher 230 is a pneumatic pressure type elevating mechanism and includes a cylinder 240 and a piston 242. The piston 242 has an end portion connected to a movable pedestal 244. The cylinder 240 is connected to a fixed pedestal 246. The fixed pedestal 246 is fixed to a housing 201 that covers the whole conveyance unit 200, a floor surface where the conveyance unit 200 is installed, or the like. Adjusting an air pressure inside the cylinder 240 moves the piston 242, thus ensuring moving the movable pedestal 244 in the height direction (z-direction). The movement of the movable pedestal 244 in the height direction allows the first stage 232 and the second stage 270 to move in the height direction. In the illustrated embodiment, an XY-stage 248 that allows the first stage 232 and the second stage 270 to move in a horizontal surface is mounted above the movable pedestal 244. The XY-stage 248 can be a known XY-stage configured to be movable in two perpendicular directions by, for example, a linear motion guide. In the illustrated embodiment, a rotation stage 250 is mounted on the XY-stage 248. The rotation stage 250 is configured to be rotatable in an X-Y plane (horizontal surface). In other words, the rotation stage 250 is configured to be rotatable around the z-axis. The known rotation stage 250 configured by, for example, a rotation bearing can be employed as the rotation stage 250. A second elevating mechanism 233 is mounted on the rotation stage 250. The second elevating mechanism 233 includes a cylinder 252 and a piston 254. The base 236 of the first stage 232 is connected to the cylinder 252. The movable piston 254 is connected to the cylinder 252, and adjusting an air pressure inside the cylinder 252 allows the piston 254 to move. The piston 254 has an end portion to which the base 274 of the second stage 270 is connected. Therefore, adjusting the air pressure inside the cylinder 252 allows the piston 254 and the second stage 270 to move in the height direction (z-direction). With the above-described configuration, the first elevating mechanism 231 can move both of the first stage 232 and the second stage 270 in the height direction (z-direction), and the second elevating mechanism 233 can move the second stage 270 in the height direction (z-direction) with respect to the first stage 232. Additionally, the first stage 232 and the second stage 270 are movable in two perpendicular directions (x- and y-directions) in the horizontal surface by the XY-stage 248. Furthermore, the first stage 232 and the second stage 270 are rotatable in the horizontal surface (around the z-axis) by the rotation stage 250. Therefore, when the substrate WF is delivered between the pusher 230 and the top ring 302 described later, the pusher 230 and the top ring 302 can be aligned. In the illustrated embodiment, while the first elevating mechanism 231 and the second elevating mechanism 233 are pneumatic pressure type elevating mechanisms, these elevating mechanisms may be fluid pressure types, or may be electrically operated type elevating mechanisms using, a motor, a ball screw, or the like.

Figure 12:
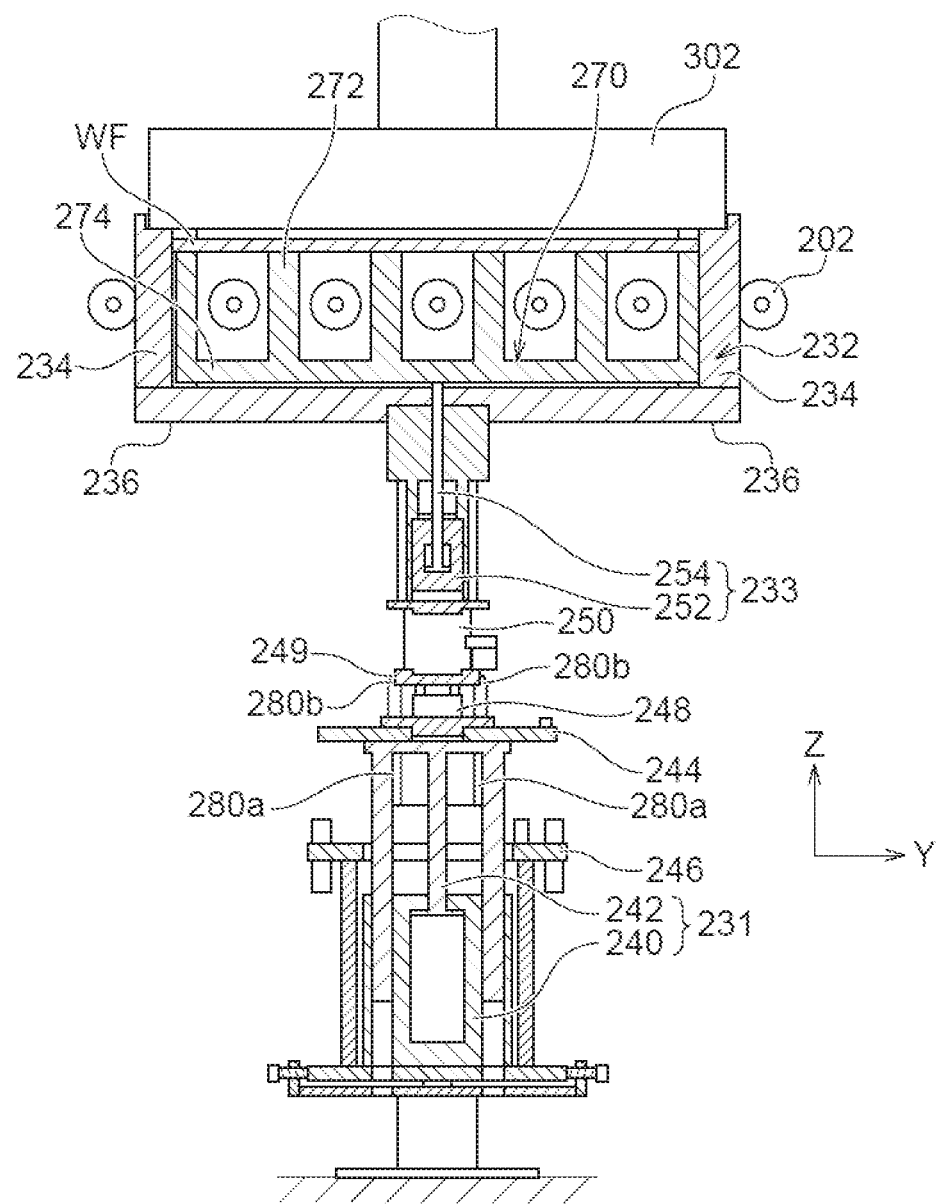
FIG. 12 is a partial cross-sectional view illustrating the first stage and the second stage at an upper position.
Figure 13:
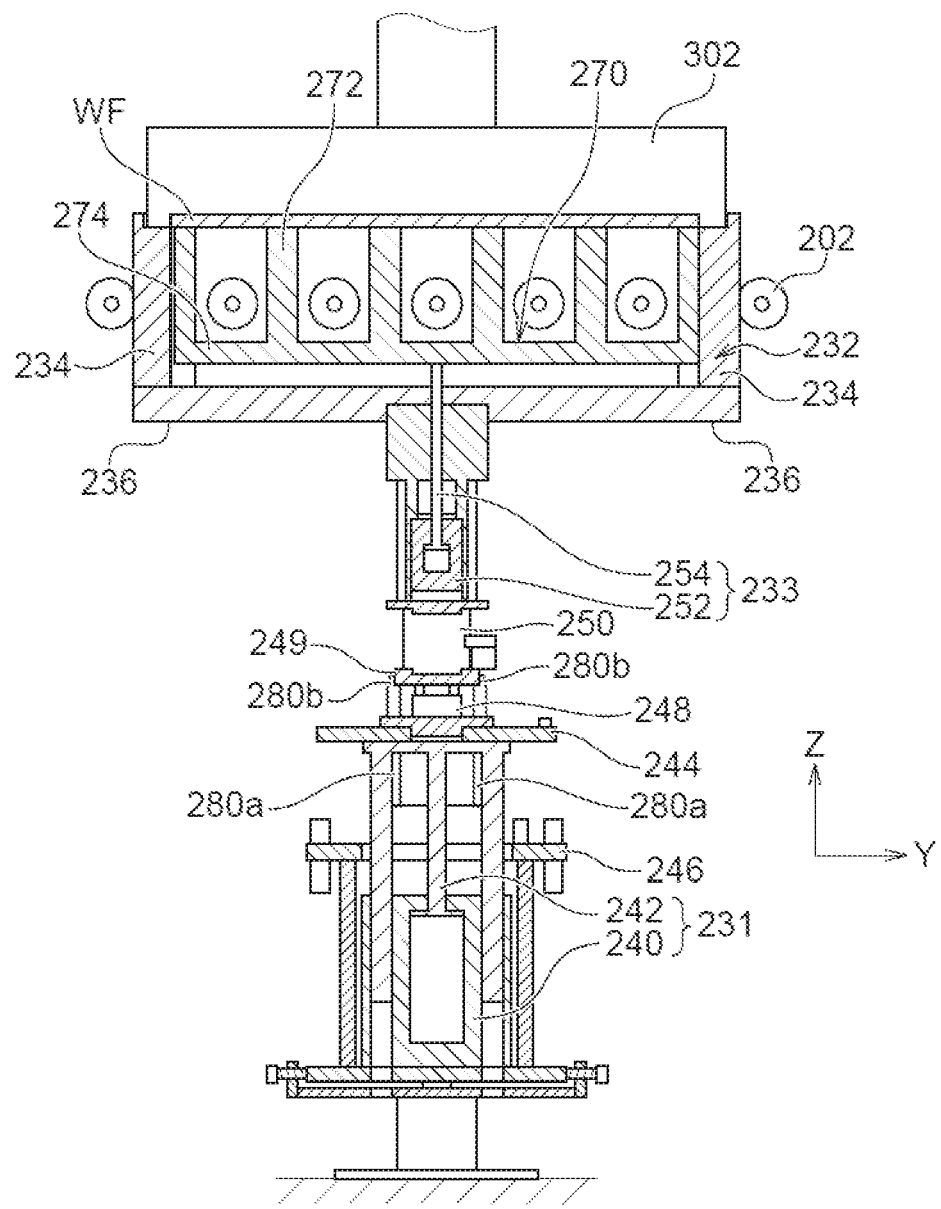
FIG. 13 is a partial cross-sectional view illustrating the first stage and the second stage at the upper position and further the second stage at a position moved up with respect to the first stage.

The first elevating mechanism 231 can move the first stage 232 and the second stage 270 between a lower position and an upper position. FIG. 9 illustrates the first stage 232 and the second stage 270 at the lower position. When the first stage 232 and the second stage 270 are at the lower position, as illustrated in FIG. 9, the end portions of the support pillars 234 of the first stage 232 and the end portions of the support pillars 272 of the second stage 270 are at a position lower than the surfaces supporting the substrate WF of the conveyance rollers 202. FIG. 12 illustrates the first stage 232 and the second stage 270 at upper position. When the first stage 232 and the second stage 270 are at the upper position, the end portions of the support pillars 234 of the first stage 232 and the end portions of the support pillars 272 of the second stage 270 are at a position higher than the surfaces supporting the substrate of the conveyance rollers 202. That is, when the first stage 232 and the second stage 270 move from the lower position to the upper position, the substrate WF disposed on the conveyance rollers 202 can be lifted by the second stage 270 to be received. FIG. 13 illustrates the first stage 232 and the second stage 270 at the upper position and further the second stage 270 at a position moved up with respect to the first stage 232. When the substrate WF is handed over to the top ring 302 described later from the pusher 230, as illustrated in FIG. 13, the second stage 270 holding the substrate WF is moved up with respect to the first stage 232.

Figure 14:
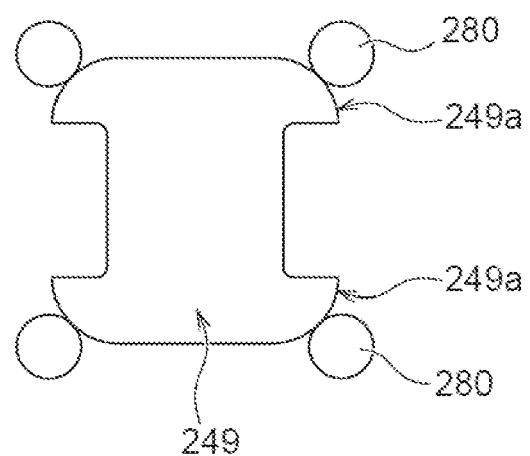
FIG. 14 is a top view illustrating an arrangement of an intermediate plate and XY-stoppers according to one embodiment.

As described above, the first stage 232 and the second stage 270 are movable in the horizontal surface by the XY-stage 248. In one embodiment, the first stage 232 and the second stage 270 are movable in the horizontal surface by the XY-stage 248 only when the first stage 232 and the second stage 270 are at the upper position and are not movable when the first stage 232 and the second stage 270 are at the lower position. In one embodiment, the pusher 230 can include XY-stoppers 280 that restrains the movement by the XY-stage 248. In the illustrated embodiment, the rotation stage 250 is connected to the XY-stage 248 via an intermediate plate 249. The pusher 230 according to the illustrated embodiment includes four rod-shaped stopper members extending in the height direction as the XY-stoppers 280. FIG. 14 is a top view illustrating an arrangement of the intermediate plate 249 and the XY-stoppers 280. As illustrated in FIG. 14, the intermediate plate 249 includes four arc portions 249a. The respective XY-stoppers 280 are disposed at positions engaging the four arc portions 249a of the intermediate plate 249. The illustrated XY-stoppers 280 are connected to the fixed pedestal 246. The rod-shaped XY-stopper 280 includes a base portion 280a having a first diameter and a distal end portion 280b having a diameter smaller than the first diameter. While the first stage 232 and the second stage 270 are at the lower position, the base portions 280a of the respective XY-stoppers 280 engage the respective four arc portions 249a of the intermediate plate 249. The base portions 280a are positioned to be in contact with the arc portions 249a of the intermediate plate 249. When the base portions 280a of the respective XY-stoppers 280 contact the respective four arc portions 249a of the intermediate plate 249, the intermediate plate 249 is unmovable in the horizontal surface. As a result, the movement of the first stage 232 and the second stage by the XY-stage 248 is inhibited. While the first stage 232 and the second stage 270 are at the upper position, the respective four arc portions 249a of the intermediate plate 249 loosely engage the distal end portions 280b of the respective XY-stoppers 280. That is, since the distal end portion 280b has the diameter smaller than that of the base portion 280a, the distal end portion 280b is away from the arc portion 249a of the intermediate plate 249 by a predetermined distance. Therefore, when the four arc portions 249a of the intermediate plate 249 loosely engage the distal end portions 280b of the respective XY-stoppers 280, the intermediate plate 249 can move by a certain amount of range in the horizontal surface.

Figure 15:
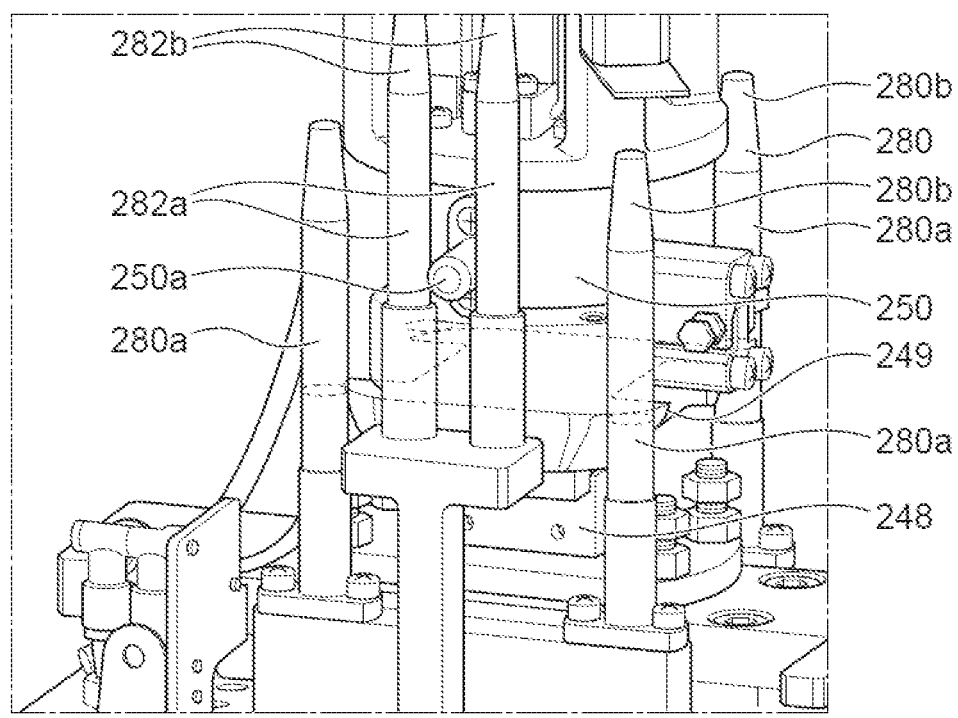
FIG. 15 is a drawing illustrating a vicinity of a rotation stage of the pusher illustrated in FIG. 8 in an enlarged manner.

As described above, the first stage 232 and the second stage 270 are rotatable in the horizontal surface by the rotation stage 250. In one embodiment, only when the first stage 232 and the second stage 270 are at the upper position, the first stage 232 and the second stage 270 are rotatable in the horizontal surface by the rotation stage 250, and while the first stage 232 and the second stage 270 are at the lower position, the first stage 232 and the second stage 270 are not rotatable. In one embodiment, as illustrated in FIG. 8, the pusher 230 can include rotation stoppers 282 that restrain the rotation by the rotation stage 250. The illustrated rotation stage 250 includes a protrusion 250a extending in the horizontal direction. The pusher 230 according to the illustrated embodiment includes two rod-shaped stopper members extending in the height direction as the rotation stoppers 282. FIG. 15 is a drawing illustrating a vicinity of the rotation stage 250 of the pusher 230 illustrated in FIG. 8 in an enlarged manner. The rotation stoppers 282 are disposed such that the protrusion 250a is sandwiched between the rod-shaped two stopper members. As illustrated in FIG. 8, the rotation stoppers 282 are connected to the fixed pedestal 246. The rod-shaped rotation stopper 282 includes a base portion 282a having a first diameter and a distal end portion 282b having a diameter smaller than the first diameter. While the first stage 232 and the second stage 270 are at the lower position, the protrusion 250a is tightly sandwiched between the base portions 282a of the two rotation stoppers 282. Therefore, while the first stage 232 and the second stage 270 are at the lower position, the base portions 282a of the two rotation stoppers 282 restrict the rotation of the protrusion 250a disposed on the rotation stage 250. As a result, the rotation of the first stage 232 and the second stage by the rotation stage 250 is inhibited. While the first stage 232 and the second stage 270 are at the upper position, the protrusion 250a of the rotation stage 250 is loosely sandwiched between the distal end portions 282b of the two rotation stoppers 282. Since the distal end portion 282b has the diameter smaller than that of the base portion 282a, the distal end portions 282b loosely restrict the rotation of the protrusion 250a on the rotation stage 250. Therefore, when the distal end portions 282b of the two rotation stoppers 282 loosely engage the protrusion 250a, the rotation stage 250 can rotate in a certain amount of range between the two distal end portions 282b.

The conveyance unit 200 illustrated in FIG. 6 and FIG. 7 includes a cleaning unit. As illustrated in FIG. 6 and FIG. 7, the cleaning unit includes cleaning nozzles 284. The cleaning nozzles 284 include upper cleaning nozzles 284a disposed on the upper side of the conveyance rollers 202 and lower cleaning nozzles 284b disposed on the lower side. The upper cleaning nozzle 284a and the lower cleaning nozzle 284b are connected to a supply source for a cleaning liquid (not illustrated). The upper cleaning nozzle 284a supplies a cleaning liquid to the top surface of the substrate WF conveyed on the conveyance rollers 202. The lower cleaning nozzle 284b supplies the cleaning liquid to the lower surface of the substrate WF conveyed on the conveyance rollers 202. The upper cleaning nozzle 284a and the lower cleaning nozzle 284b have widths to the same extent to the width of the substrate WF conveyed on the conveyance rollers 202 or widths more than that. When the substrate WF is conveyed on the conveyance rollers 202, the whole surface of the substrate WF is cleaned. As illustrated in FIG. 6 and FIG. 7, the cleaning unit is positioned on the downstream side than the substrate delivery position of the pusher 230 of the conveyance unit 200.

Figure 16:
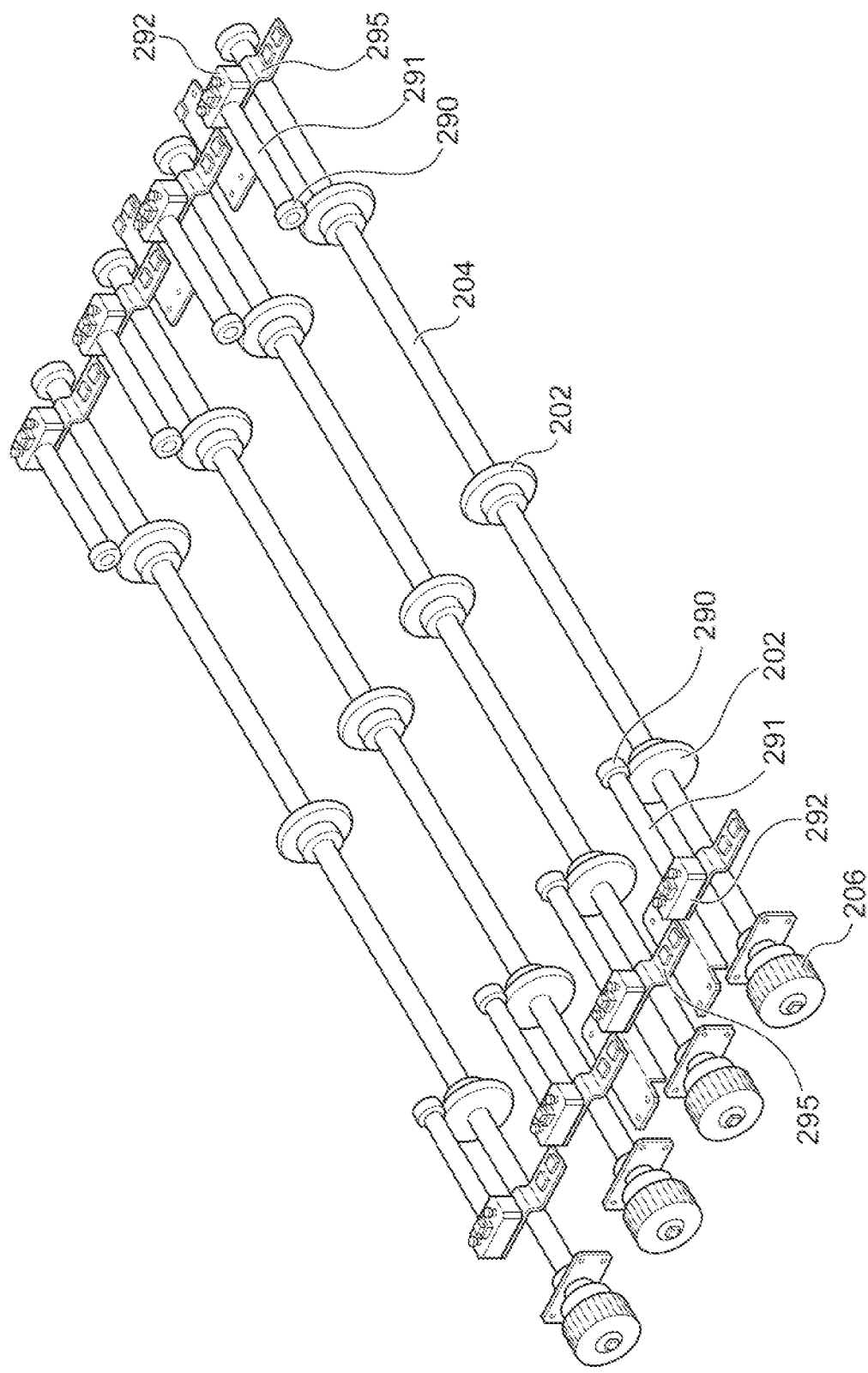
FIG. 16 is a perspective view illustrating conveyance rollers and pressing rollers in a cleaning unit according to one embodiment.
Figure 17:
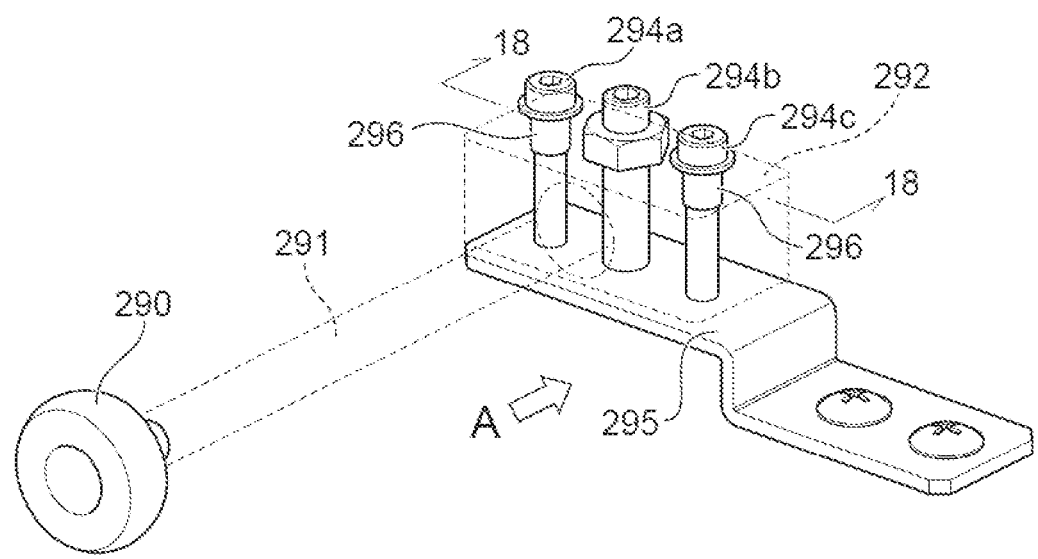
FIG. 17 is a perspective view illustrating the single pressing roller according to one embodiment.
Figure 18:
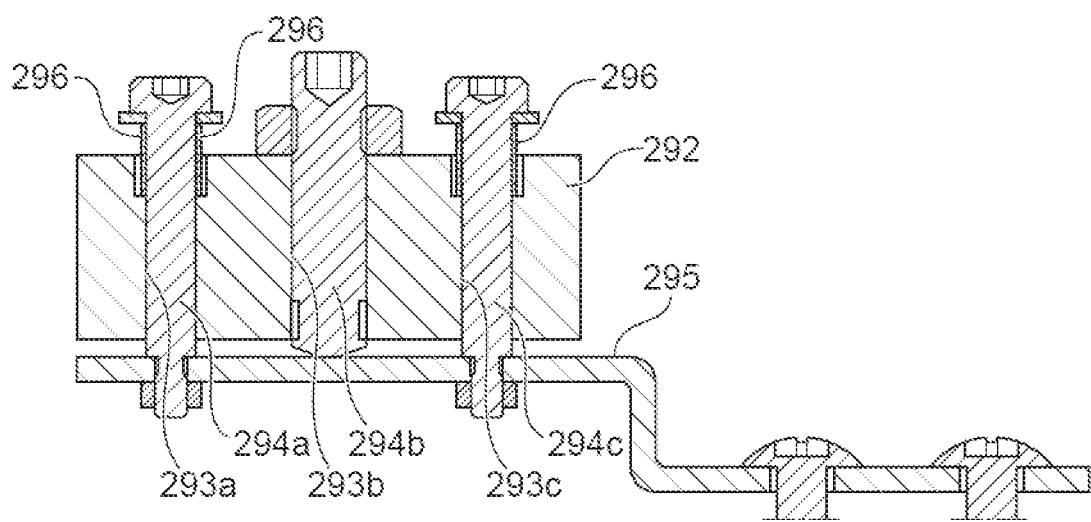
FIG. 18 is a cross-sectional view viewing a block and screws illustrated in FIG. 17 in the direction of the arrow 18.

As illustrated in FIG. 6, in the cleaning unit, pressing rollers 290 are disposed above the conveyance rollers 202. FIG. 16 is a perspective view illustrating the conveyance rollers 202 and the pressing rollers 290 in the cleaning unit. FIG. 17 is a perspective view illustrating the single pressing roller 290. In FIG. 17, a support shaft 291 and a block 292 are indicated by the dashed lines. As illustrated in FIG. 16 and FIG. 17, the pressing roller 290 is freely mounted to be rotatable to the support shaft 291. The support shaft 291 is fixed to the block 292 or integrally formed with the block 292. As illustrated in FIG. 16 and FIG. 17, the block 292 has three holes 293a to 293c penetrating in the height direction and screws 294a to 294c are inserted into the holes 293a to 293c, respectively. FIG. 18 is a cross-sectional view viewing the block 292 and the screws 294a to 294c illustrated in FIG. 17 in the direction of the arrow 18. As illustrated in FIG. 18, the block 292 is connected to a base 295 with two screws 294a, 294c. Between the respective two screws 294a, 294c and the block 292, elastic members 296, such as springs, are disposed, and the block 292 is biased toward the base 295 with the elastic members 296. The base 295 is fixed to a member that supports a member fixed to the conveyance roller 202, for example, the roller shaft 204. A distal end of a screw 294b at the center of the block 292 contacts the base 295, and a distance between the block 292 and the base 295 can be adjusted by an insertion depth of the screw 294b. In other words, the insertion depth of the screw 294b allows adjusting the distance between the conveyance roller 202 and the pressing roller 290. It is only necessary to appropriately determine the distance between the conveyance roller 202 and the pressing roller 290 according to a thickness of the conveyed substrate WF. The position of the pressing roller 290 is changeable according to the dimensions of the substrate WF conveyed by the conveyance rollers 202 therewith.

As illustrated in FIG. 6, the sensor 216d is disposed in the proximity of an inlet of the cleaning unit. In one embodiment, when the sensor 216d detects the substrate WF, the cleaning nozzle 284 can jet the cleaning liquid to start cleaning the substrate WF. During cleaning of the substrate WF, the rotational speed of the conveyance rollers 202 may be set to a speed for cleaning. In the embodiment of FIG. 6, the sensor 216f is disposed in the proximity of an outlet of the cleaning unit. In one embodiment, when the sensor 216f detects the substrate WF, the jet of the cleaning liquid from the cleaning nozzle 284 can be terminated. During cleaning of the substrate WF, since the substrate WF is sandwiched by the conveyance rollers 202 and the pressing rollers 290 to be conveyed, even during the jet of the cleaning liquid, the substrate WF can be stably conveyed.

As illustrated in FIG. 6, the conveyance unit 200 includes an openable/closable outlet shutter 286. The conveyance unit 200 includes the sensor 216g in the proximity of the outlet. In one embodiment, when the sensor 216g detects the substrate WF, the outlet shutter 286 may be opened to convey the substrate WF to the next unit. In one embodiment, when the sensor 216g detects the substrate WF, the conveyance of the substrate WF by the conveyance rollers 202 may be stopped without opening the outlet shutter 286, a process by the next unit may be waited, and when the next unit is ready for receiving the substrate, the outlet shutter 286 may be opened to convey the substrate WF to the next unit.

<Polishing Unit>

Figure 19:
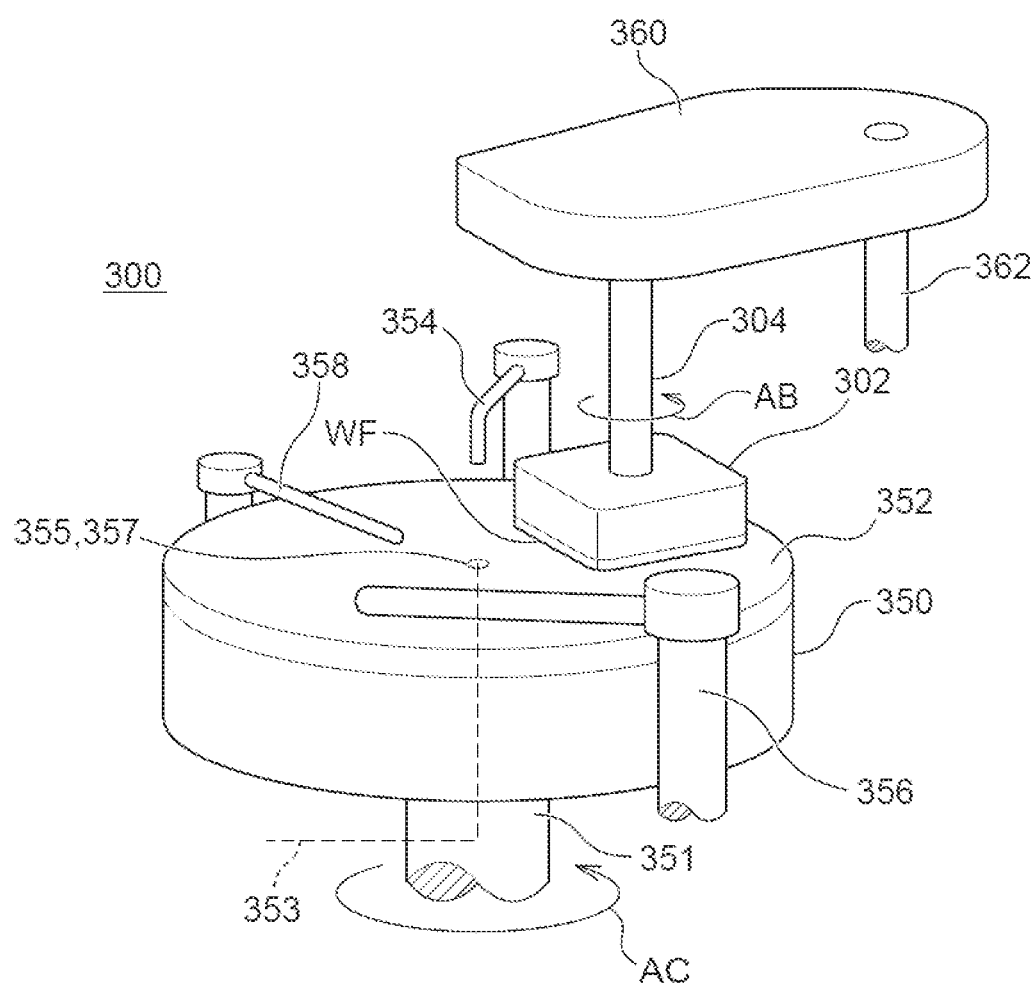
FIG. 19 is a perspective view schematically illustrating a polishing unit according to one embodiment.

FIG. 19 is a perspective view schematically illustrating the polishing unit 300 according to one embodiment. The substrate processing apparatus 1000 illustrated in FIG. 1 includes the two polishing units 300A and 300B. Since the two polishing units 300A and 300B can have identical configurations, the following will collectively give a description as the polishing unit 300.

As illustrated in FIG. 19, the polishing unit 300 includes a polishing table 350 and the top ring 302. The polishing table 350 is rotatably driven by a driving source (not illustrated). A polishing pad 352 is pasted to the polishing table 350. In one embodiment, the polishing pad 352 may be pasted via a layer to facilitate separation from the polishing table 350. Examples of the layer include a silicone layer and a fluorine-based resin layer, and, for example, the layer described in Japanese Unexamined Patent Application Publication No. 2014-176950 may be used. The top ring 302 holds the substrate WF and pushes the substrate WF to the polishing pad 352. The top ring 302 is rotatably driven by a driving source (not illustrated). The substrate WF is held to the top ring 302 to be pushed to the polishing pad 352, and thus the substrate WF is polished.

In one embodiment, grooves are provided in the surface of the polishing pad 352. The grooves control a flow of the polishing liquid supplied to the surface of the polishing pad 352. Any size, depth, cross-sectional shape, and pattern of the grooves may be used.

FIGS. 27A to 27F are drawings illustrating a pattern of grooves 359 formed in the polishing pad 352 according to one embodiment. FIGS. 27A to 27F are plan views illustrating the surface of the polishing pad 352, that is, the surface in contact with the substrate WF during polishing. In the embodiment illustrated in FIGS. 27A to 27C, the grooves 359 in the polishing pad 352 have a concentric pattern and a pattern in which the grooves 359 radially extend from the center of the circular polishing pad 352. In the illustrated embodiment, the radial grooves 359 do not extend up to the outermost periphery of the polishing pad 352 but terminate in the middle of the polishing pad 352. As another embodiment, some of the grooves 359 may extend up to the outermost periphery of the polishing pad 352. During polishing, the polishing pad 352 rotates together with the polishing table 350. Therefore, a polishing liquid supplied from a through-hole 357 positioned at the substantially center of a polishing liquid supply nozzle 354 described later and the polishing pad 352 receives a force to the outside in the radial direction of the polishing pad 352 by centrifugal force and flows to the outside in the radial direction. At this time, as illustrated, since the radial grooves 359 terminate in the middle of the polishing pad 352, the polishing liquid overflows from the radial grooves 359 at the terminating end portions and is further guided to the concentric grooves 359, and this facilitates entrance of the polishing liquid between the polishing pad 352 and the substrate. As illustrated, the grooves 359 having the various lengths radially extend and communicate with the concentric grooves, thereby ensuring efficiently supplying the polishing liquid between the polishing pad 352 and the substrate. In the embodiment illustrated in FIGS. 27D to 27F, the grooves 359 are formed in a grid pattern. In the pattern of the grooves 359 illustrated in FIG. 27D, the grids having identical sizes are formed and the grooves 359 do not extend up to the outermost periphery. In the pattern of the grooves 359 illustrated in FIG. 27E, grids having different sizes are formed. In the pattern of the grooves 359 illustrated in FIG. 27F, grids having identical sizes are formed, and the grooves 359 do not extend up to the outermost periphery but terminate. Polishing the substrate WF with the polishing pad having the grooves allows obtaining a satisfactory polishing rate while suppressing usage of the polishing liquid.

FIGS. 28A to 28F are drawings illustrating a pattern of the grooves 359 formed in the polishing pad 352 according to one embodiment. FIGS. 28A to 28F are plan views illustrating the surface of the polishing pad 352, that is, the surface in contact with the substrate WF during polishing. In the embodiment illustrated in FIGS. 28A to 28C, the grooves 359 in the polishing pad 352 have a concentric pattern and a pattern in which the grooves 359 radially extend from the center of the circular polishing pad 352. In the illustrated embodiment, the radial grooves 359 do not extend up to the outermost periphery of the polishing pad 352 but terminate in the middle of the polishing pad 352. As another embodiment, some of the radial grooves 359 may extend up to the outermost periphery of the polishing pad 352. In the embodiments illustrated in FIGS. 28A to 28C, in some of the radial grooves 359 terminating in the middle, the radial grooves 359 are further formed up to the outermost periphery with constant intervals from the outside in the radial direction of the terminating radial grooves 359. With the radial grooves 359, the polishing liquid overflowed from the grooves 359 (the grooves for supply) at the terminating end portions again enters the grooves 359 (the grooves for discharge) disposed outside to be separated, thus promoting the discharge of the polishing liquid. With the grooves for discharge, the polishing liquid that has been already used and a polishing waste aggregated on the polishing pad are less likely to deposit, and formation of scratch on the substrate WF during polishing can be further prevented, compared with the example of FIG. 27 absent of the grooves for discharge. The discharge groove may have a cross-sectional area larger than that of the supply groove. Note that the action of the concentric grooves 359 is similar to the description of the above-described 27A to 27C. In the embodiments illustrated in FIGS. 28D to 28F, the grooves 359 are formed in a grid pattern. In the embodiments illustrated in FIGS. 28D to 28F, the grooves 359 (the grooves for supply) in the grid pattern do not extend up to the outermost periphery but terminate in the middle, and the grooves 359 (the grooves for discharge) are further formed to the outermost periphery outside the grooves 359 (the grooves for supply) with constant intervals. The illustrated and above-described patterns of the grooves 359 are one example, and grooves in any pattern may be formed. A pattern of grooves in which the illustrated features are arbitrarily combined may be formed. Polishing the substrate WF with the polishing pad having the grooves allows obtaining a satisfactory polishing rate while suppressing the usage of the polishing liquid, and further inhibiting a scratch due to a polishing waste.

As illustrated in FIG. 19, the polishing unit 300 includes the polishing liquid supply nozzle 354 that supplies the polishing pad 352 with the polishing liquid or a dressing liquid. The polishing liquid is, for example, a slurry. The dressing liquid is, for example, pure water. As illustrated in FIG. 19, in the polishing table 350 and a table shaft 351, a passage 353 to supply the polishing liquid is disposed. The passage 353 communicates with an opening portion 355 in the surface of the polishing table 350. The polishing pad 352 has the through-hole 357 at a position corresponding to the opening portion 355 in the polishing table 350. The polishing liquid passing through the passage 353 is supplied to the surface of the polishing pad 352 from the opening portion 355 in the polishing table 350 and the through-hole 357 in the polishing pad 352. Note that the numbers of the opening portions 355 in the polishing table 350 and the through-holes 357 in the polishing pad 352 may be one or plural. Although the opening portion 355 in the polishing table 350 and the through-hole 357 in the polishing pad 352 are disposed at any position, the opening portion 355 and the through-hole 357 are disposed in the proximity of the center of the polishing table 350 in one embodiment. The polishing unit 300 includes a dresser 356 that conditions the polishing pad 352. The polishing unit 300 includes an atomizer 358 that jets a liquid or a mixture fluid of a liquid and a gas to the polishing pad 352. An example of the liquid jetted from the atomizer 358 is pure water and an example of the gas is a nitrogen gas.

The top ring 302 is supported by a top ring shaft 304. The top ring 302 rotates around an axial center of the top ring shaft 304 as indicated by the arrow AB by a drive unit (not illustrated). The top ring shaft 304 is vertically movable by a driving mechanism (not illustrated). The polishing table 350 is supported to the table shaft 351. The polishing table 350 rotates around the axial center of the table shaft 351 as indicated by the arrow AC by a drive unit (not illustrated)

The substrate WF is held to the surface of the top ring 302 opposed to the polishing pad 352 by vacuum suction. During polishing, the polishing liquid is supplied from the polishing liquid supply nozzle 354 and/or the through-hole 357 in the polishing pad 352 to a polishing surface of the polishing pad 352. During polishing, the polishing table 350 and the top ring 302 are rotatably driven. The substrate WF is polished by being pushed to the polishing surface of the polishing pad 352 by the top ring 302.

As illustrated in FIG. 19, the top ring shaft 304 is connected to an arm 360, and the arm 360 is swingable around a rotation shaft 362. The arm 360 may be fixed or swung during the polishing of the substrate WF such that the top ring 302 passes through the center of the polishing pad 352. The arm 360 may be fixed or swung during the polishing of the substrate WF such that the substrate WF covers the through-hole 357 in the polishing pad 352. As illustrated in FIG. 1, the swingable arm 360 allows the top ring 302 to move to the conveyance unit 200. As described above with FIG. 9, FIG. 12, FIG. 13, and the like, when the top ring 302 moves to the substrate delivery position of the conveyance unit 200, the top ring 302 can receive the substrate WF from the pusher 230. Additionally, after polishing the substrate WF in the polishing unit 300, the substrate WF can be handed over from the top ring 302 to the pusher 230. The top ring 302, its rotation angle of which is detected by a rotation angle sensor (not illustrated), is configured to preliminarily stop the rotation to allow the retainer member 308 of the top ring 302 to be aligned with the pusher 230 by the depressed portion formed by the support pillars 234 at the four corner portions when the substrate WF is received from/delivered to the pusher 230 as described above.

Figure 20:
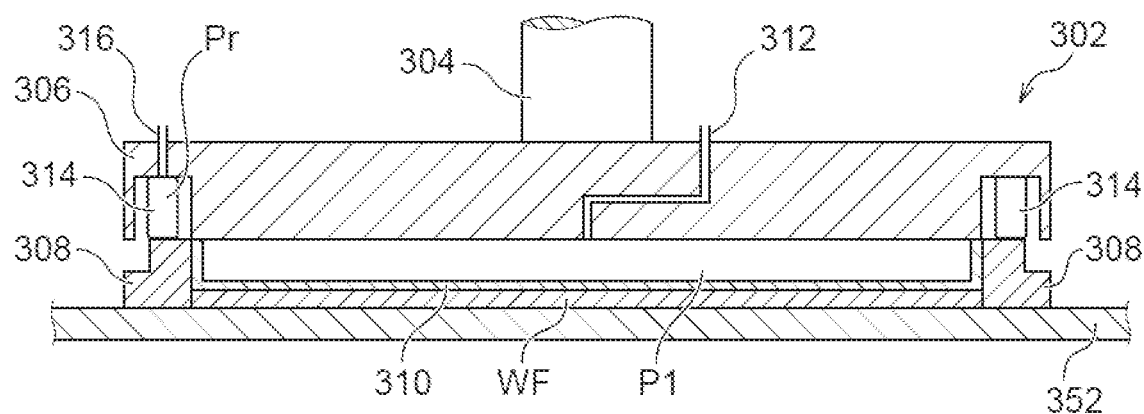
FIG. 20 is a cross-sectional side view schematically illustrating a structure of a top ring according to one embodiment.

FIG. 20 is a cross-sectional side view schematically illustrating a structure of the top ring 302 according to one embodiment. The top ring 302 is connected to a lower end of the top ring shaft 304. The top ring 302 includes ahead body 306 having a substantially rectangular shape and the retainer member 308 disposed on the lower portion of the head body 306. The head body 306 can be made of a material having high strength and rigidity, such as a metal and a ceramic. The retainer member 308 can be made of a resin material, a ceramic, or the like having high rigidity.

In a space formed inside the head body 306 and the retainer member 308, an elastic pad 310 abutting on the substrate WF is housed. Between the elastic pad 310 and the head body 306, a pressure chamber (air bag) P1 is disposed. The pressure chamber P1 is formed by the elastic pad 310 and the head body 306. A pressurized fluid, such as pressurized air, is supplied to the pressure chamber P1 via a fluid passage 312, or vacuum drawing is performed on the pressure chamber P1. In the embodiment illustrated in FIG. 20, the pressure chamber P1 is formed over the whole surface of the substrate WF to be held. As one embodiment, a plurality of pressure chambers can be formed by the elastic pads 310 and the head bodies 306. To form the plurality of pressure chambers, a fluid passage communicating with each pressure chamber may be disposed to independently control a pressure of each pressure chamber.

The peripheral end portion of the substrate WF is surrounded by the retainer member 308 so as not to project the substrate WF from the head body 306 during polishing. An elastic bag 314 is disposed between the retainer member 308 and the head body 306, and a pressure chamber Pr is formed inside the elastic bag 314. Expansion/contraction of the elastic bag 314 allows the retainer member 308 to vertically move relative to the head body 306. A fluid passage 316 communicates with the pressure chamber Pr, and the pressurized fluid, such as pressurized air, is supplied to the pressure chamber Pr through the fluid passage 316. An internal pressure of the pressure chamber Pr is adjustable. Accordingly, independently from the pressing force to the polishing pad 352 by the substrate WF, a pressing force of the retainer member 308 to the polishing pad 352 is adjustable. In the top ring 302 according to the embodiment illustrated in FIG. 20, a plurality of the retainer members 308 can be disposed, and the pressing force of each retainer member 308 to the polishing pad 352 is independently adjustable by each elastic bag. In one embodiment, one retainer member 308 having a substantially rectangular ring shape and one elastic bag 314 may be employed.

<Drying Unit>

The drying unit is a device that dries the substrate WF. In the substrate processing apparatus 1000 illustrated in FIG. 1, the drying unit 500 dries the substrate WF cleaned by the cleaning unit in the conveyance unit 200 after being polished by the polishing unit 300. As illustrated in FIG. 1, the drying unit 500 is disposed downstream of the conveyance unit 200.

Figure 21:
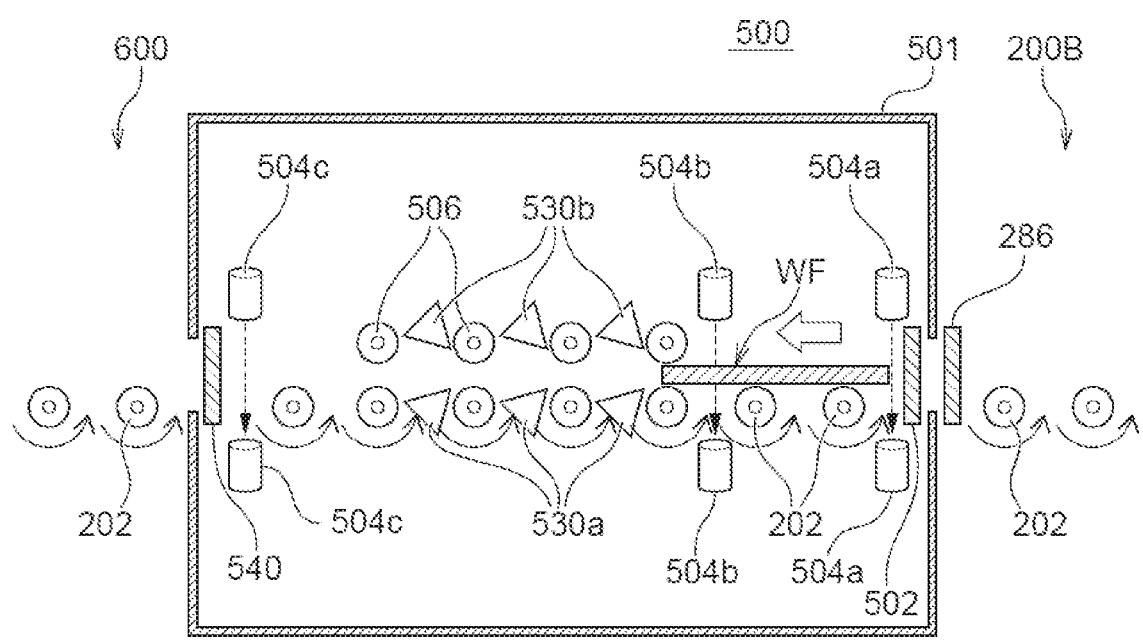
FIG. 21 is a side view schematically illustrating a drying unit according to one embodiment.

FIG. 21 is a side view schematically illustrating the drying unit 500 according to one embodiment. The drying unit 500 includes the conveyance rollers 202 that convey the substrate WF. In one embodiment, the conveyance rollers 202 in the drying unit 500 can be made of a conductive polymer. The conveyance rollers 202 are electrically grounded via the roller shafts 204 or the like. This is performed to prevent the substrate WF from being charged, resulting in damage of the substrate WF. In one embodiment, the drying unit 500 may include an ionizer (not illustrated) to prevent the substrate WF from being charged. Similarly to the conveyance rollers 202 in the conveyance unit 200, the conveyance rollers 202 in the drying unit 500 are driven by the gears 206 and the motor 208. As illustrated in FIG. 21, the drying unit 500 includes an inlet shutter 502 on the inlet side. The inlet shutter 502 is configured to be openable/closable. As illustrated in FIG. 21, the drying unit 500 includes sensors 504 that detect the presence or absence of the substrate WF at a predetermined position on the conveyance rollers 202. The sensor 504 can be a sensor of any form, and, for example, can be an optical sensor. In the embodiment illustrated in FIG. 21, the three sensors 504 (504a to 504c) are disposed in the drying unit 500. In one embodiment, according to the detection of the substrate WF by the sensors 504a to 504c, an operation of the drying unit 500 can be controlled. Positions and roles of the respective sensors 504a to 504c will be described later.

In the embodiment illustrated in FIG. 21, the drying unit 500 includes nozzles 530 that jet a gas to the substrate WF conveyed on the conveyance rollers 202. Examples of the gas can be compressed air or nitrogen. In the illustrated embodiment, the nozzles 530 include lower nozzles 530a disposed on the lower side of the conveyance rollers 202 and upper nozzles 530b disposed on the upper side of the conveyance rollers 202. The lower nozzle 530a is disposed so as to jet the gas to the lower surface of the substrate WF conveyed on the conveyance rollers 202. The upper nozzle 530b is disposed so as to jet the gas to the top surface of the substrate WF conveyed on the conveyance rollers 202. The lower nozzle 530a and the upper nozzle 530b have widths to the same extent or more than the width of the conveyed substrate WF. Therefore, the gas can be sprayed over the whole substrate WF that is conveyed by the lower nozzles 530a and the upper nozzles 530b. The drying unit 500 blows off water droplets on the conveyed substrate WF by the lower nozzles 530a and the upper nozzles 530b, thus ensuring drying the substrate WF. Each one of the lower nozzle 530a and the upper nozzle 530b may be disposed, or a plurality of the lower nozzles 530a and the upper nozzles 530b may be disposed in the conveying direction of the substrate WF. In the embodiment illustrated in FIG. 21, the three upper nozzles 530b and the three lower nozzles 530a are disposed. As the form of each nozzle 530, a gas supply port having a slit shape extending to the extent of the width of the substrate WF can be used.

The drying unit 500 illustrated in FIG. 21 includes upper conveyance rollers 506 disposed above the conveyance rollers 202. The upper conveyance rollers 506 are connected to a power source and configured to be rotatable. In one embodiment, the upper conveyance rollers 506 are driven by the gears 206 and the motor 208 similarly to the conveyance rollers 202.

Figure 22:
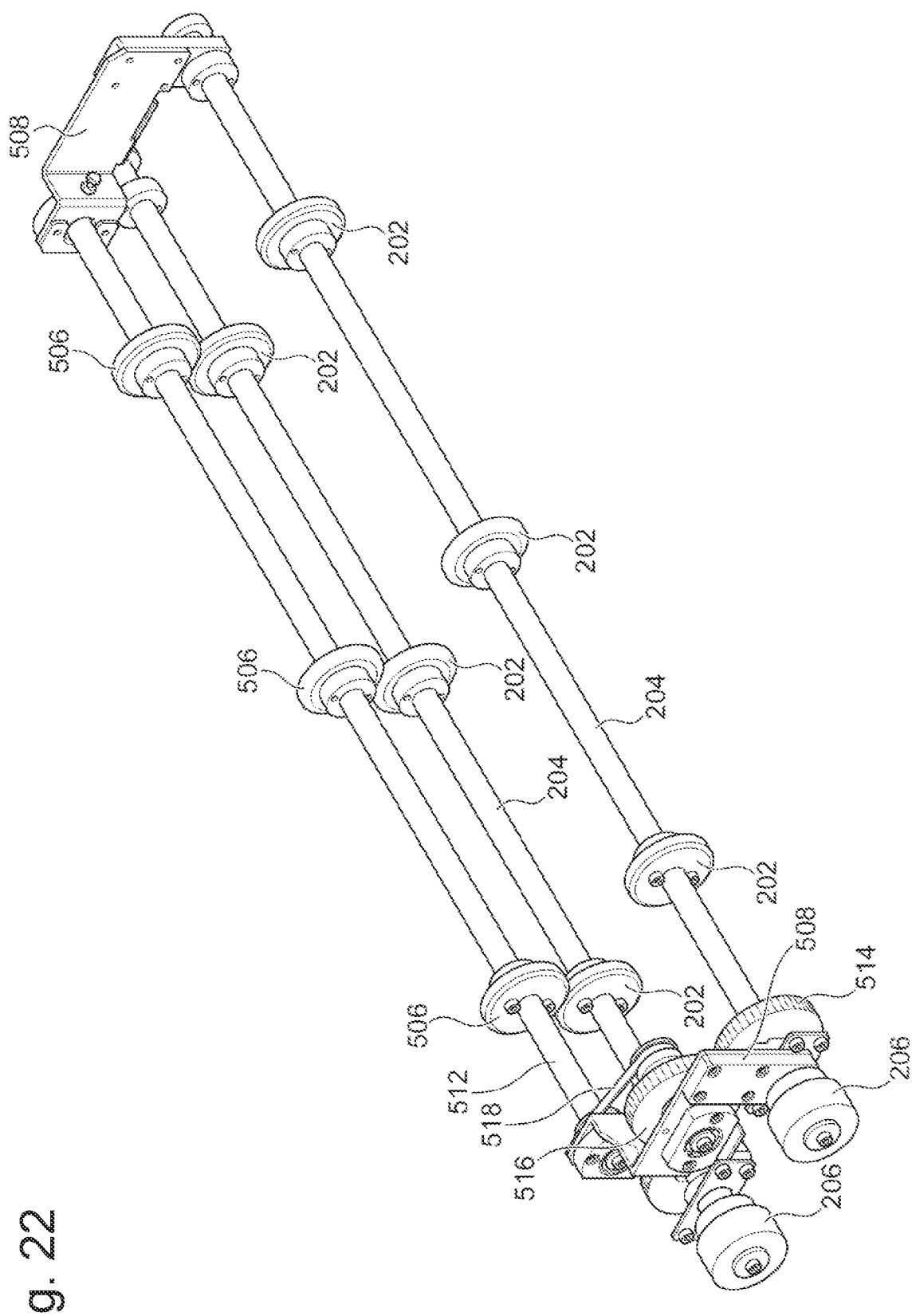
FIG. 22 is a perspective view illustrating a driving mechanism of the conveyance rollers and upper conveyance rollers according to one embodiment.
Figure 23:
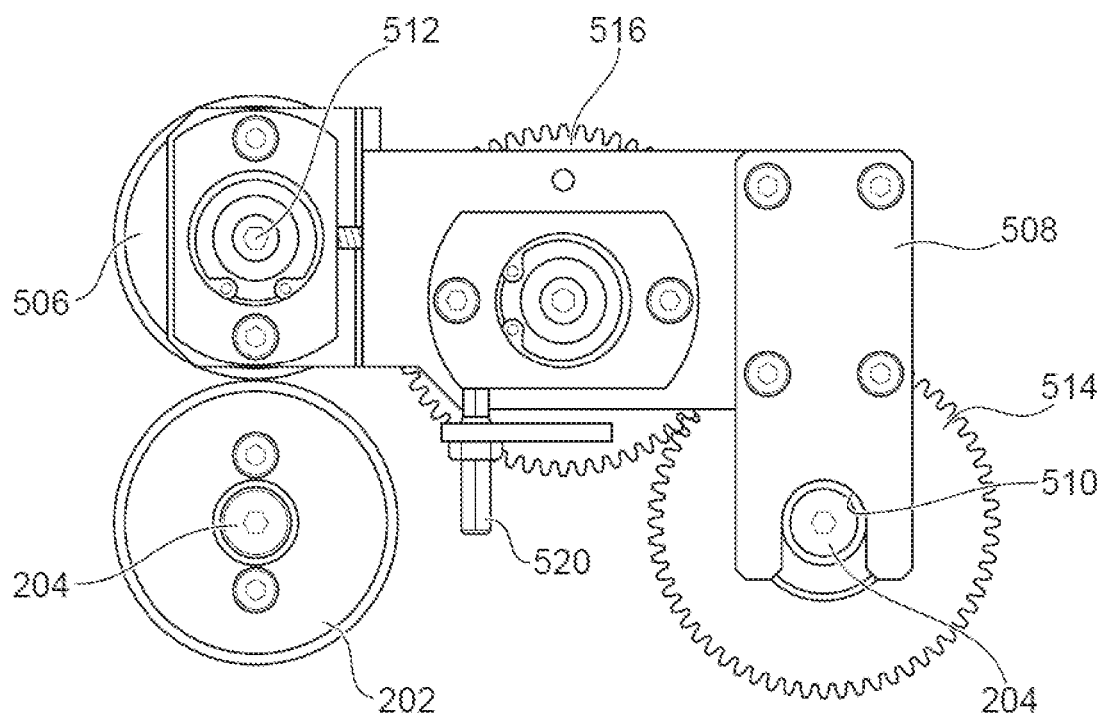
FIG. 23 is a side view describing the driving mechanism illustrated in FIG. 22.
Figure 24:
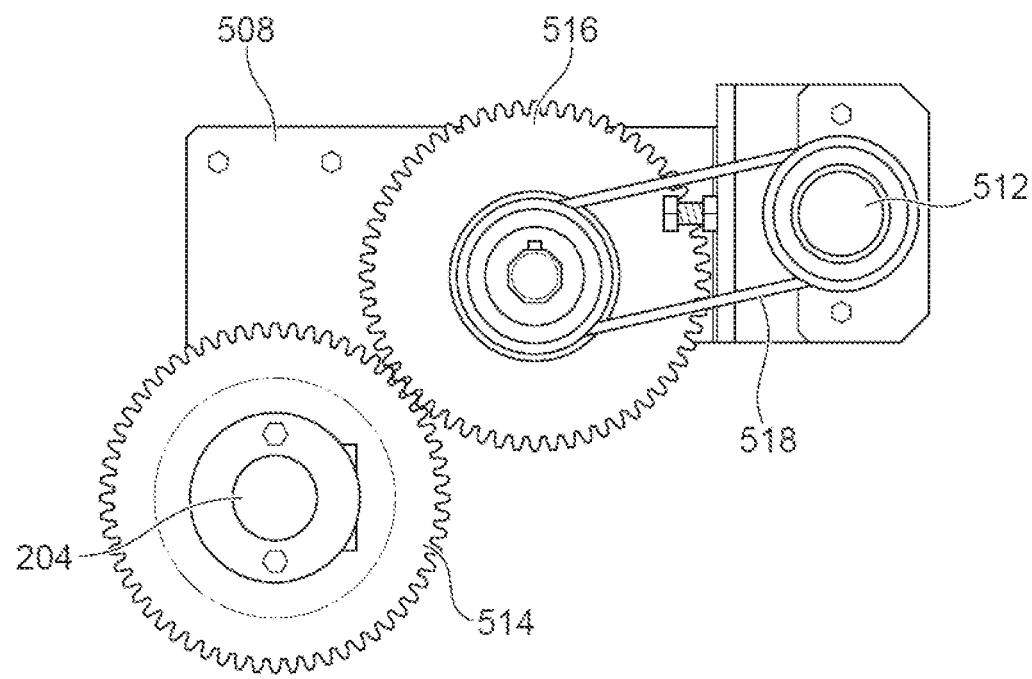
FIG. 24 is a drawing describing the driving mechanism of the upper conveyance roller according to one embodiment.

FIG. 22 to FIG. 24 are drawings describing a driving mechanism for the upper conveyance rollers 506 according to one embodiment. FIG. 22 is a perspective view illustrating the driving mechanism for the conveyance rollers 202 and the upper conveyance rollers 506. FIG. 23 is a side view describing the driving mechanism illustrated in FIG. 22. FIG. 24 is a side view viewing the driving mechanism illustrated in FIG. 23 from the opposite side. The driving mechanism for the upper conveyance rollers 506 includes connecting members 508. As illustrated, the connecting member 508 is a substantially L-shaped member. As illustrated in FIG. 23, a depressed portion 510 that engages the roller shaft 204, which rotates the conveyance roller 202, is disposed in one end portion of the connecting member 508. An upper roller shaft 512 that rotates the upper conveyance roller 506 is connected to the other end portion of the connecting member 508 via a bearing or the like. In the illustrated embodiment, the upper conveyance roller 506 can be disposed on the adjacent conveyance roller 202 via the L-shaped connecting member 508. In the illustrated embodiment, the connecting member 508 is freely displaceable around the roller shaft 204 inside the depressed portion 510. Therefore, due to weights of the upper conveyance roller 506, the upper roller shaft 512, and the like, the upper conveyance roller 506 is biased toward the conveyance rollers 202, which is positioned below. However, according to the thickness of the conveyed substrate WF, the upper conveyance roller 506 can move in the upper direction. Note that the position of the upper conveyance roller 506 is changeable according to the dimensions of the substrate WF conveyed by the conveyance rollers 202 therewith.

As illustrated in FIG. 22 and FIG. 23, a first gear 514 is connected to the roller shaft 204, and the rotation of the roller shaft 204 rotates the first gear 514. A second gear 516 is connected to the first gear 514, and the rotation of the first gear 514 is transmitted to the second gear 516. A belt 518 is connected to the second gear 516, and the rotation of the second gear 516 is transmitted to the belt 518. The belt 518 is connected to the upper roller shaft 512, and the rotation of the belt 518 rotates the upper roller shaft 512. Such a structure allows transmitting the rotational force of the conveyance roller 202 to the upper conveyance roller 506. In the illustrated embodiment, while the first gear 514 and the second gear 516 are gears including mechanical toothed wheels, magnet gears may be used.

As illustrated in FIG. 23, the driving mechanism for the upper conveyance rollers 506 includes a stopper 520 in contact with the connecting member 508. Adjusting the position of the stopper 520 allows restricting the lower limit of displacement of the connecting member 508 around the roller shaft 204, thus ensuring adjusting a distance between the upper conveyance roller 506 and the conveyance roller 202, which is positioned below the upper conveyance roller 506, by the stopper 520. The distance between the upper conveyance roller 506 and the conveyance rollers 202 may be changed according to the thickness of the conveyed substrate WF.

In one embodiment, as illustrated in FIG. 21, the drying unit 500 includes an outlet shutter 540 on the outlet side. The outlet shutter 540 is configured to be openable/closable. When the drying unit 500 dries the substrate WF, the outlet shutter 540 can be opened to convey the substrate WF after being dried to the outside of the drying unit 500.

The drying unit 500 according to the above-described embodiment conveys the substrate WF sandwiched between the conveyance rollers 202 and the upper conveyance rollers 506 in the up-down direction. Therefore, even when the nozzle 530 sprays a gas to the substrate WF, the substrate WF can be stably conveyed.

<Unloading Unit>

The unloading unit 600 is a unit that carries out the substrate WT after the processes, such as polishing and cleaning, have been performed to the outside of the substrate processing apparatus 1000. In the substrate processing apparatus 1000 illustrated in FIG. 1, the unloading unit 600 receives the substrate after being dried in the drying unit 500. As illustrated in FIG. 1, the unloading unit 600 is disposed downstream of the drying unit 500.

Figure 25:
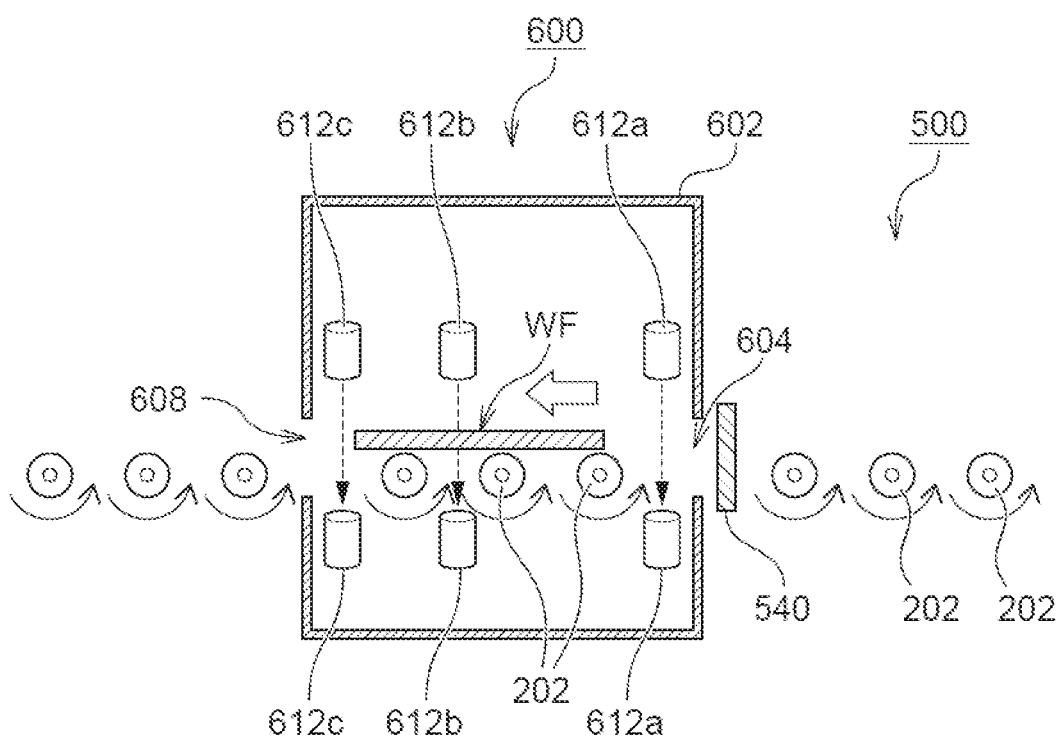
FIG. 25 is a side view schematically illustrating an unloading unit according to one embodiment.

FIG. 25 is a side view schematically illustrating the unloading unit 600 according to one embodiment. In one embodiment, the unloading unit 600 includes a housing 602. The housing 602 includes an inlet opening 604 on the side where the substrate WF is received. In the embodiment illustrated in FIG. 25, the right side is the inlet side. The unloading unit 600 receives the substrate WF from the inlet opening 604. In one embodiment, the unloading unit 600 is configured to be compliant to a mechanical equipment interface standard (IPC-SMEMA-9851) of Surface Mount Equipment Manufacturers Association (SMEMA).

In the embodiment illustrated in FIG. 25, the unloading unit 600 includes the plurality of conveyance rollers 202 that convey the substrate WF. The rotation of the conveyance rollers 202 allows conveying the substrate on the conveyance rollers 202 in a predetermined direction. In one embodiment, the conveyance rollers 202 in the unloading unit 600 can be made of a conductive polymer. In one embodiment, the conveyance rollers 202 are electrically grounded via the roller shafts 204 or the like. This is performed to prevent the substrate WF from being charged, resulting in damage of the substrate WF. In one embodiment, the unloading unit 600 may include an ionizer (not illustrated) to prevent the substrate WF from being charged.

In the illustrated embodiment, the housing 602 of the unloading unit 600 includes an outlet opening 608 of the substrate WF. The unloading unit 600 includes sensors 612 that detect the presence or absence of the substrate WF at a predetermined position on the conveyance rollers 202. The sensor 612 can be a sensor of any form, and, for example, can be an optical sensor. In the embodiment illustrated in FIG. 25, the three sensors 612 are disposed in the housing 602, one being a sensor 612a disposed in the proximity of the inlet opening 604; one being a sensor 612b disposed in the proximity of the center of the unloading unit 600; and another one being a sensor 612c disposed in the proximity of the outlet opening 608. In one embodiment, according to the detection of the substrate WF by the sensors 612, an operation of the unloading unit 600 can be controlled. For example, when the sensor 612a in the proximity of the inlet opening 604 detects the presence of the substrate WF, the rotation of the conveyance rollers 202 inside the unloading unit 600 may be started, or the rotation speed of the conveyance rollers 202 may be changed. In one embodiment, when the loading unit 100 requires a reversing machine, the unloading unit 600 may also include the reversing machine (not illustrated) that reverses the substrate WF.

The following will describe the conveyance path of the substrate WF by the above-described substrate processing apparatus 1000. The operation of the substrate processing apparatus 1000 is controlled by the controller 900. Another processing device is disposed on the upstream of the substrate processing apparatus 1000. The substrate WF processed by the other processing device on the upstream side is carried in from the inlet opening 104 of the loading unit 100 in the substrate processing apparatus 1000. In the above-described embodiment, the substrate WF is conveyed with the surface polished by the polishing unit 300 facing downward. In one embodiment, when the sensor 112a in the loading unit 100 detects the substrate WF, the operation of the conveyance rollers 202 in the loading unit 100 can be started. The reader 106 reads the ID of the substrate WF introduced to the loading unit 100. The process in the substrate processing apparatus 1000 may be determined according to the read ID. When the introduced substrate WF is determined as not the process target by the substrate processing apparatus 1000 by the read ID, the conveyance by the conveyance rollers 202 may be stopped. When the substrate WF is conveyed inside the loading unit 100 by the conveyance rollers 202, the sensor 112c detects the substrate WF. In a case where the sensor 112c detects the substrate WF and the conveyance unit 200A is ready to receive the substrate WF, the inlet shutter 218 of the conveyance unit 200A opens, and the substrate WF is conveyed from the loading unit 100 to the conveyance unit 200A by the conveyance rollers 202. When the conveyance unit 200A is not ready to receive the substrate WF, the operation of the conveyance rollers 202 in the loading unit 100 is stopped and the operation is waited until the conveyance unit 200A is ready to receive.

When the substrate WF is conveyed to the conveyance unit 200A, the sensor 216a disposed on the inlet side of the conveyance unit 200A detects the substrate WF. When the sensor 216a confirms that the rear of the substrate WF has passed, the inlet shutter 218 is closed. Afterwards, while the position of the substrate WF is monitored by the sensor 216b, the substrate WF is conveyed by the conveyance rollers 202 in the conveyance unit 200A. At this time, the stopper 220 is moved into the conveyance path of the substrate WF by the stopper moving mechanism 222. The substrate WF conveyed on the conveyance rollers 202 contacts the stopper 220 and is stopped. Additionally, the sensor 216c is disposed at the position of the stopper 220, and when the sensor 216c detects the substrate WF, the operation of the conveyance rollers 202 is stopped. The substrate WF stopped at the position (substrate delivery position) of the stopper 220 is handed over to the top ring 302 of the polishing unit 300A via the pusher 230.

When the substrate WF is stopped at the substrate delivery position, the arm 360 of the polishing unit 300A is swung to position the top ring 302 on the substrate WF in the conveyance unit 200A. FIG. 9 illustrates a state in which the pusher 230 is at the lower position when the delivery of the substrate by the pusher 230 starts. The first stage 232 and the second stage 270 are moved up from the lower position illustrated in FIG. 9 by the first elevating mechanism 231. When the first stage 232 and the second stage 270 move up, the support pillars 234 of the first stage 232 and the support pillars 272 of the second stage 270 pass through between the conveyance rollers 202. At this time, the support pillars 272 of the second stage 270 lift the substrate WF from below. While the first stage 232 and the second stage 270 are at the moved-up position by the first elevating mechanism 231, as described above, the position and an angle orientation of the pusher 230 in the horizontal surface are adjusted by the XY-stage 248 and the rotation stage 250 to perform the alignment such that the support pillars 234 of the first stage 232 support the retainer member 308 of the top ring 302. FIG. 12 illustrates a state in which the first stage 232 and the second stage 270 are at the moved-up position by the first elevating mechanism 231 and the support pillars 234 of the first stage 232 support the retainer member 308 of the top ring 302. In the state, the second stage 270 is moved up with respect to the first stage 232 by the second elevating mechanism 233. In the state, the substrate WF is disposed on the lower surface of the elastic pad 310 of the top ring 302. FIG. 13 illustrates a state in which the substrate WF is disposed on the lower surface of the elastic pad 310 of the top ring 302. Next, the top ring 302 holds the substrate WF to the lower surface of the elastic pad 310 by vacuum suction.

When the substrate WF is held to the top ring 302, the arm 360 is swung such that the top ring 302 holding the substrate WF is at the position opposed to the polishing pad 352 in the polishing unit 300A. Afterwards, while the polishing table 350 and the top ring 302 are rotated, the substrate WF is pressed to the polishing pad 352 to polish the substrate WF. During polishing of the substrate WF, the polishing liquid is supplied to the surface of the polishing pad 352 through the polishing liquid supply nozzle 354 and the passage 353.

When the polishing of the substrate WF in the polishing unit 300A ends, the arm 360 is swung to move the top ring 302 holding the substrate WF up to the substrate delivery position of the conveyance unit 200A. As illustrated in FIG. 12, the top ring 302 is moved such that the retainer member 308 of the top ring 302 is supported to the first stage 232. Afterwards, the vacuum suction on the top ring 302 is released and the substrate WF is supported to the support pillars 272 of the second stage 270. Thereafter, as illustrated in FIG. 9, the pusher 230 is moved down to hand over the substrate WF on the conveyance rollers 202.

When the polishing of the substrate WF in the polishing unit 300A ends, the polishing unit 300A performs, for example, dressing and cleaning of the polishing pad 352 using, for example, the dresser 356 and the atomizer 358.

When the substrate WF is handed over from the polishing unit 300A to the conveyance unit 200A, the conveyance rollers 202 are started again to convey the substrate WF. The sensor 216d is disposed at the position where the cleaning of the substrate WF starts, and when the sensor 216d detects the substrate WF, the cleaning of the substrate WF starts. When the substrate WF is cleaned, the rotation speed of the conveyance rollers 202 may be changed to a speed for cleaning. While the substrate WF is conveyed by the conveyance rollers 202, the cleaning liquid is jetted from the upper cleaning nozzle 284a and the lower cleaning nozzle 284b to the substrate WF to clean the substrate WF. The sensor 216e is disposed inside the cleaning unit, and while the position of the substrate WF is monitored by the sensor 216e, the substrate WF is conveyed while being cleaned. The sensor 216f is disposed at the position where the cleaning of the substrate WF ends, and when the sensor 216f detects the substrate WF, the jet of the cleaning liquid from the upper cleaning nozzle 284a and the lower cleaning nozzle 284b stops. When the cleaning of the substrate WF ends, the rotation speed of the conveyance rollers 202 are changed to a speed for conveyance. The sensor 216g is disposed in the proximity of the outlet of the conveyance unit 200A. When the sensor 216g detects the substrate WF and the conveyance unit 200B, which is the next unit, is ready to receive the substrate WF, the outlet shutter 286 is opened to convey the substrate WF from the conveyance unit 200A to the conveyance unit 200B. In a case where the polishing unit 300B is not ready to receive the substrate WF when the sensor 216g detects the substrate WF, the rotation of the conveyance rollers 202 is stopped and the substrate WF is caused to stand by until the polishing unit 300B is ready to receive the substrate WF.

In one embodiment, the process of the substrate WF in the conveyance unit 200B can be similarly to that of the conveyance unit 200A described above. This process typically includes a case where the polishing unit 300A and the polishing unit 300B polish the identical substrate WF in two stages. In one embodiment, only one of the polishing unit 300A or the polishing unit 300B may polish the substrate WF (only one-stage polishing). For example, in a case where only the polishing unit 300A polishes the substrate WF and the polishing unit 300B does not perform polishing, the conveyance unit 200B does not deliver the substrate WF to the polishing unit 300B and the polishing unit 300B does not clean the substrate WF but the substrate is conveyed by the conveyance rollers 202 to hand over the substrate WF to the next unit, the drying unit 500. In a case where the polishing unit 300A does not perform polishing and only the polishing unit 300B polishes the substrate, the conveyance unit 200A does not deliver the substrate WF to the polishing unit 300A and the polishing unit 300A does not clean the substrate WF but the substrate is conveyed by the conveyance rollers 202 to hand over the substrate WF to the next unit, the conveyance unit 200B.

In the substrate processing apparatus 1000 illustrated in FIG. 1, the substrate WF is conveyed from the conveyance unit 200B to the drying unit 500. When the drying unit 500 receives the substrate WF, the outlet shutter 286 of the conveyance unit 200B and the inlet shutter 502 of the drying unit 500 open, and the substrate WF is conveyed from the conveyance unit 200B to the drying unit 500 by the conveyance rollers 202. When it is detected that the substrate WF has passed through the sensor 504a, which is disposed in the proximity of the inlet of the drying unit 500, the inlet shutter 502 of the drying unit 500 and the outlet shutter 286 of the conveyance unit 200B are closed. The sensor 504b is disposed at a position where the drying unit 500 starts drying the substrate WF, and when the substrate WF is conveyed inside the drying unit 500 with the conveyance rollers 202 and the sensor 504b detects the substrate WF, the jet of the gas starts from the lower nozzle 530a and the upper nozzle 530b. The sensor 504c is disposed in the proximity of the outlet of the drying unit 500, and when the sensor 504c detects the substrate WF, the jet of the gas from the lower nozzle 530a and the upper nozzle 530b is stopped. When the sensor 504c detects the substrate WT, the outlet shutter 540 is opened, and the substrate WF is conveyed from the drying unit 500 to the unloading unit 600.

The substrate WF conveyed to the unloading unit 600 is conveyed up to the outlet by the conveyance rollers 202 while being monitored by the sensors 612a to 612c, and is conveyed to the outside of the substrate processing apparatus 1000 from the outlet opening 608. Another processing device for the next treatment process of the substrate WF is disposed on the outlet side of the unloading unit 600, and the substrate WF is handed over from the unloading unit 600 to the processing device for the next treatment process.

Figure 26:
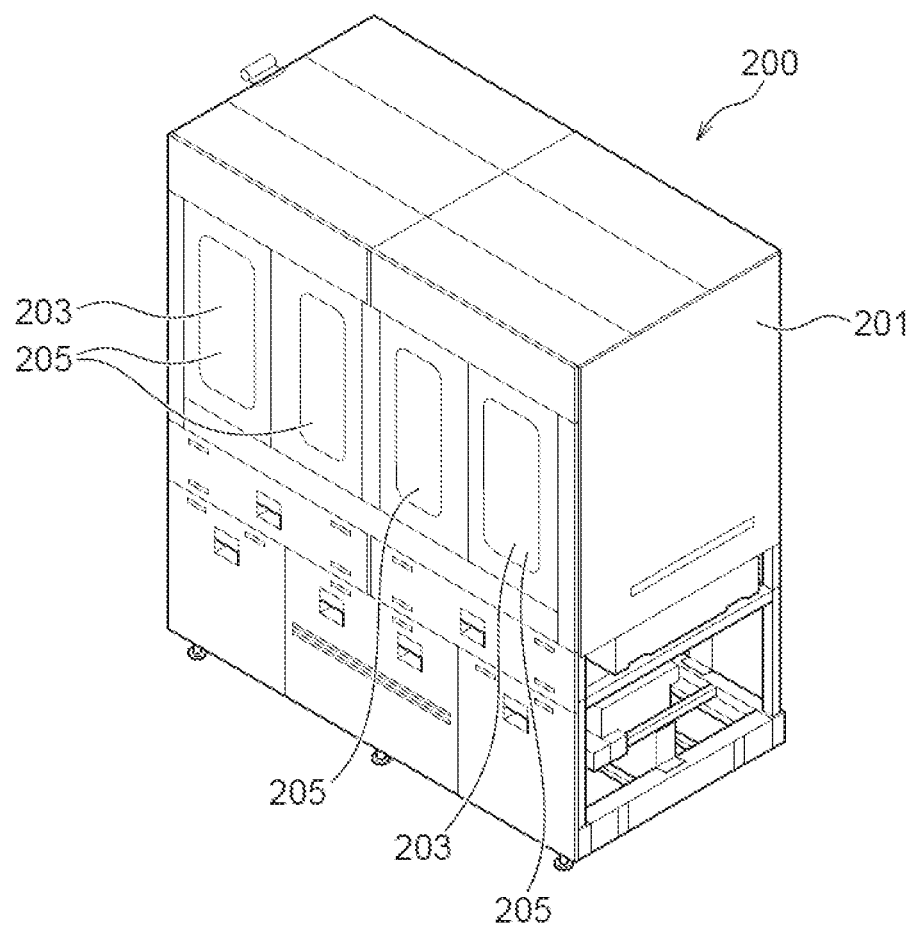
FIG. 26 is a drawing illustrating a housing of the conveyance unit as one example.
Figure 27A:
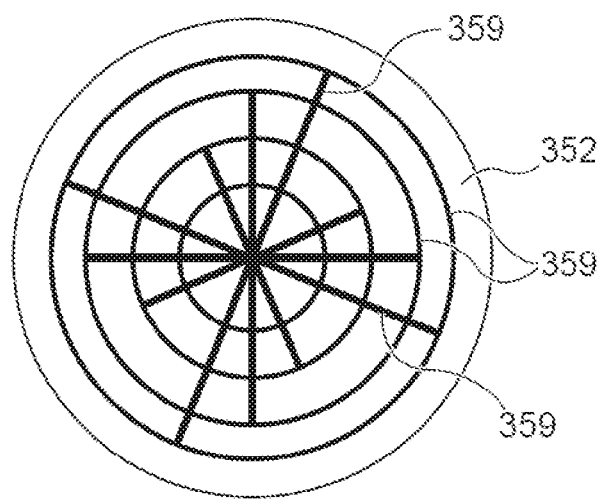
FIG. 27A is a drawing illustrating a pattern of grooves formed in a polishing pad according to one embodiment.
Figure 27B:
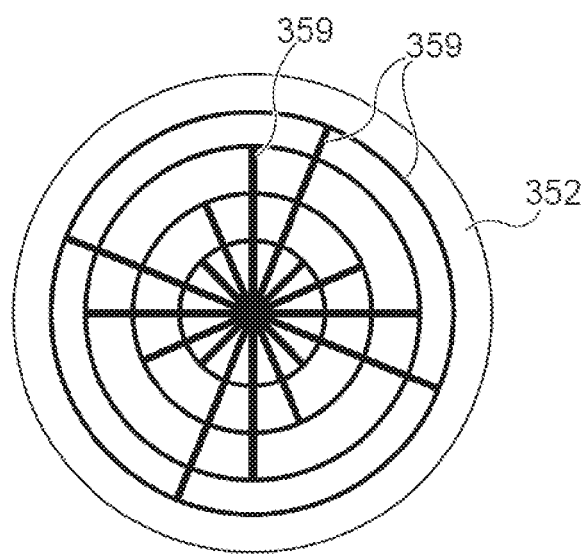
FIG. 27B is a drawing illustrating a pattern of grooves formed in the polishing pad according to one embodiment.
Figure 27C:
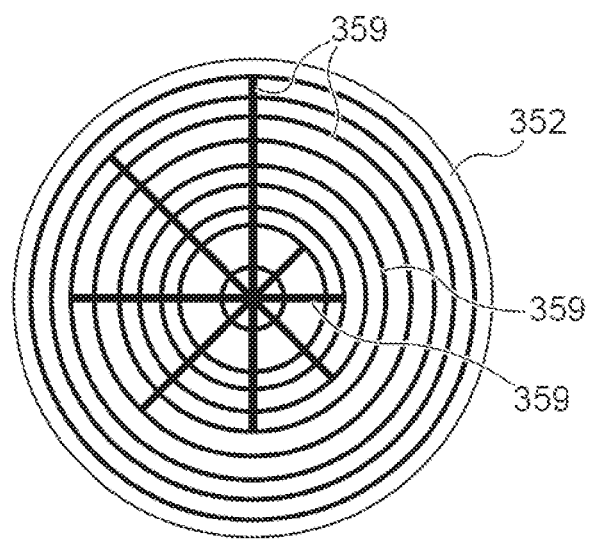
FIG. 27C is a drawing illustrating a pattern of grooves formed in the polishing pad according to one embodiment.
Figure 27D:
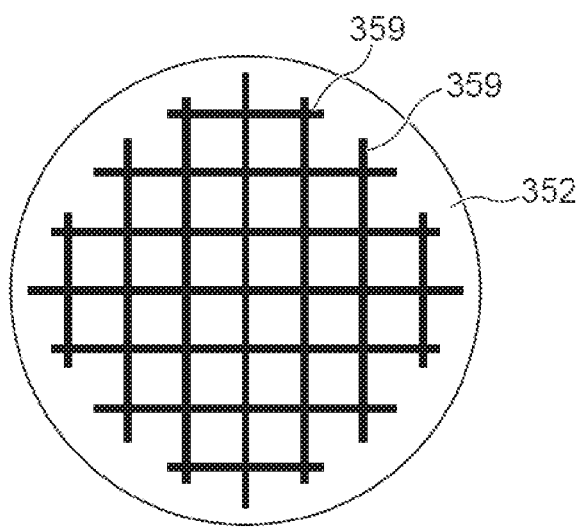
FIG. 27D is a drawing illustrating a pattern of grooves formed in the polishing pad according to one embodiment.
Figure 27E:
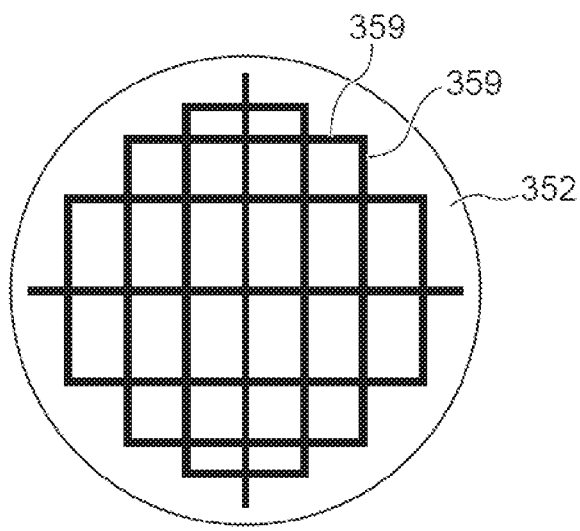
FIG. 27E is a drawing illustrating a pattern of grooves formed in the polishing pad according to one embodiment.
Figure 27F:
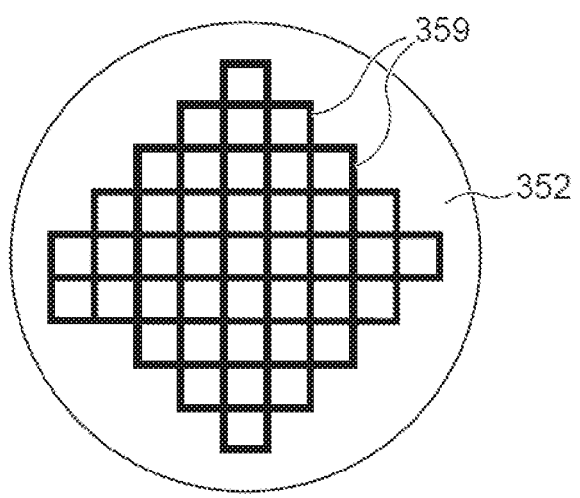
FIG. 27F is a drawing illustrating a pattern of grooves formed in the polishing pad according to one embodiment.
Figure 28A:
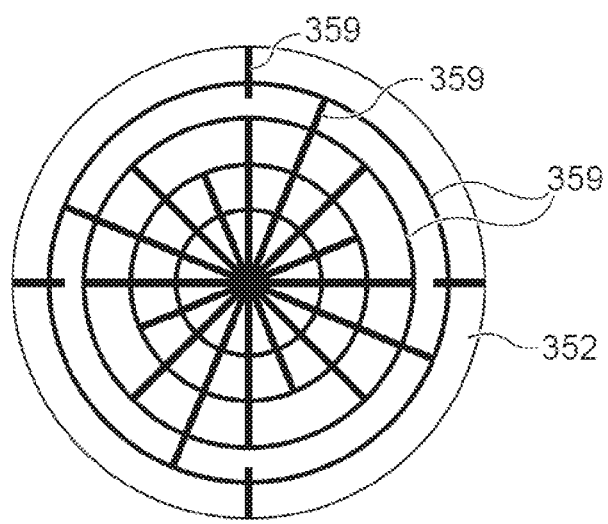
FIG. 28A is a drawing illustrating a pattern of grooves formed in the polishing pad according to one embodiment.
Figure 28B:
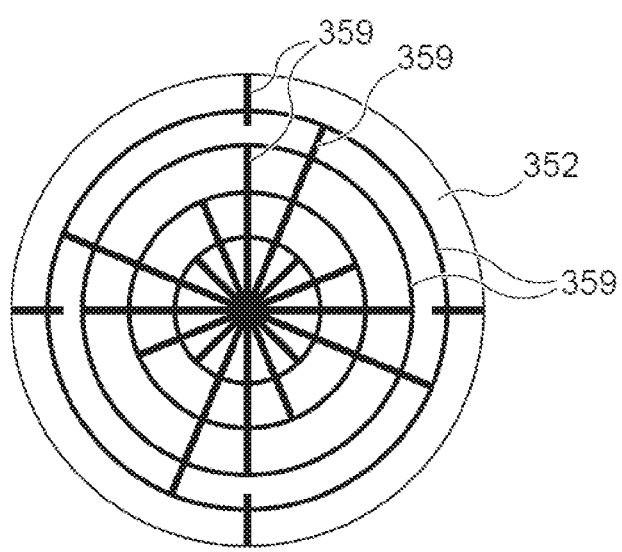
FIG. 28B is a drawing illustrating a pattern of grooves formed in the polishing pad according to one embodiment.
Figure 28C:
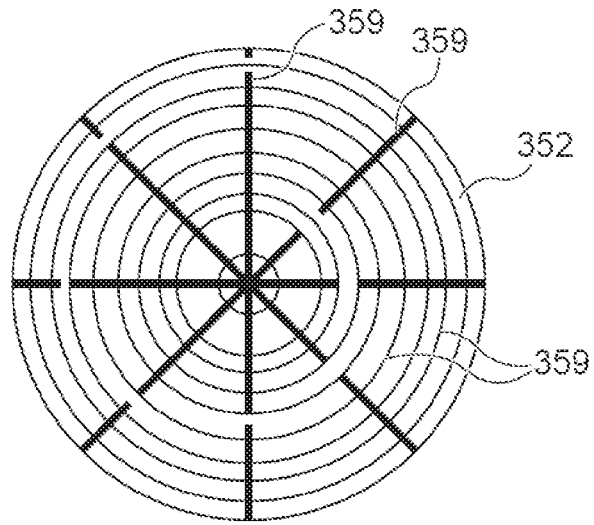
FIG. 28C is a drawing illustrating a pattern of grooves formed in the polishing pad according to one embodiment.
Figure 28D:
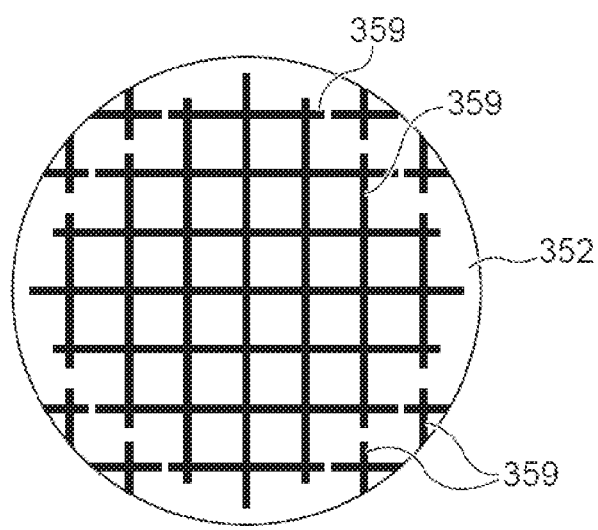
FIG. 28D is a drawing illustrating a pattern of grooves formed in the polishing pad according to one embodiment.
Figure 28E:
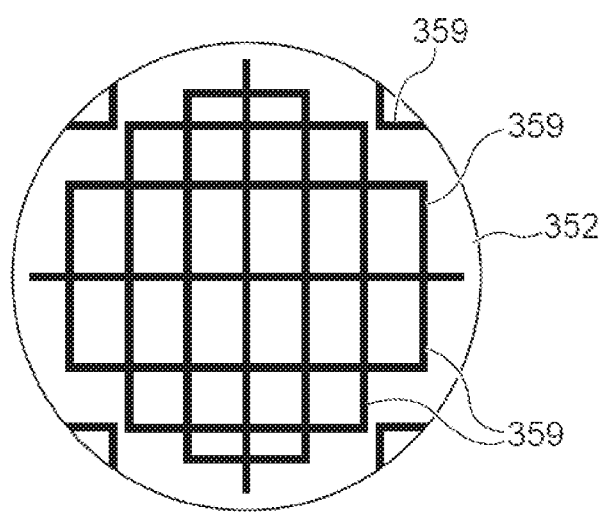
FIG. 28E is a drawing illustrating a pattern of grooves formed in the polishing pad according to one embodiment.
Figure 28F:
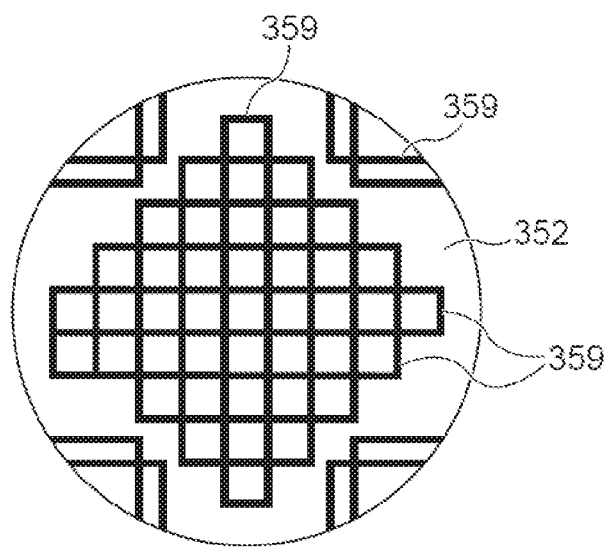
FIG. 28F is a drawing illustrating a pattern of grooves formed in the polishing pad according to one embodiment.

The substrate processing apparatus 1000 illustrated in FIG. 1 includes the two conveyance units 200 and the two polishing units 300. However, each of the conveyance unit 200 and the polishing unit 300 may be one or may be three or more. As described above, the loading unit 100, the conveyance unit 200, the polishing unit 300, the drying unit 500, and the unloading unit 600 each can be an independent unit. A housing of these units can include a window to observe the inside. FIG. 26 is a drawing illustrating the housing 201 of the conveyance unit 200 as one example. As illustrated in FIG. 26, the housing 201 of the conveyance unit 200 includes openable/closable doors 203 in the front. The door 203 includes a window 205 through which the inside of the conveyance unit 200 is observed. A light shielding member that blocks a light from outside, for example, a light shielding sheet may be mounted to the window 205. The light shielding member only needs to have a light shielding property that can prevent photocorrosion to the substrate WF when a light reaches the substrate WF. While FIG. 26 illustrates the doors 203 and the windows 205 disposed in the housing 201 of the conveyance unit 200 as one example, similar doors and/or windows can be disposed in the other loading unit 100, drying unit 500, and unloading unit 600.

From the above-described embodiments, at least the following technical ideas are grasped.

[Configuration 1]

According to the configuration 1, there is provided a substrate conveying apparatus for conveying a rectangular substrate. The substrate conveying apparatus includes a plurality of conveyance rollers, a plurality of roller shafts, a motor, and a pusher. The plurality of conveyance rollers are configured to support a lower surface of the substrate. To the plurality of roller shafts, the plurality of conveyance rollers are mounted. The motor is configured to rotate the plurality of roller shafts. The pusher is for lifting the substrate on the plurality of conveyance rollers such that the substrate is separated away from the plurality of conveyance rollers. The pusher includes a stage configured to pass through a clearance between the plurality of roller shafts.

[Configuration 2]

According to the configuration 2, in the substrate conveying apparatus according to the configuration 1, the substrate conveying apparatus further includes a supporting member disposed between the plurality of conveyance rollers.

[Configuration 3]

According to the configuration 3, in the substrate conveying apparatus according to the configuration 1 or 2, the substrate conveying apparatus includes a plurality of guide rollers configured to support the substrate in a width direction perpendicular to a conveying direction of the substrate.

[Configuration 4]

According to the configuration 4, in the substrate conveying apparatus according to any one of the configuration 1 to the configuration 3, the substrate has a non-pattern area not used as a device. The plurality of conveyance rollers are arranged to be contactable with the non-pattern area in the substrate.

[Configuration 5]

According to the configuration 5, in the substrate conveying apparatus according to any one of the configuration 1 to the configuration 4, at least a part of the plurality of conveyance rollers are made of a conductive polymer.

[Configuration 6]

According to the configuration 6, in the substrate conveying apparatus according to any one of the configuration 1 to the configuration 5, the substrate conveying apparatus further includes a magnet gear. The motor is configured to rotate the roller shafts via the magnet gear.

[Configuration 7]

According to the configuration 7, in the substrate conveying apparatus according to any one of the configuration 1 to the configuration 6, the substrate conveying apparatus further includes a stopper configured to enter a conveyance path of the substrate conveyed on the plurality of conveyance rollers, and to contact the substrate during the conveyance.

[Configuration 8]

According to the configuration 8, in the substrate conveying apparatus according to any one of the configuration 1 to the configuration 7, the substrate conveying apparatus further includes a sensor for sensing presence or absence of the substrate at a predetermined position on the plurality of conveyance rollers.

[Configuration 9]

According to the configuration 9, in the substrate conveying apparatus according to any one of the configuration 1 to the configuration 8, the substrate conveying apparatus further includes a plurality of support rollers configured to support a top surface of the substrate conveyed by the plurality of conveyance rollers.

[Configuration 10]

According to the configuration 10, in the substrate conveying apparatus according to any one of the configuration 1 to the configuration 9, the motor configured to rotate the plurality of roller shafts is a servomotor.

[Configuration 11]

According to the configuration 11, in the substrate conveying apparatus according to any one of the configuration 1 to the configuration 10, the stage of the pusher includes a plurality of support pillars. The pusher includes an elevating mechanism configured to move up and down the stage in an up-down direction. The elevating mechanism is configured to move the stage between an upper position as a position where the stages moves up and a lower position as a position where the stage moves down. The elevating mechanism is configured such that when the stage moves from the lower position to the upper position, at least a part of the plurality of support pillars of the stage pass through a clearance between the plurality of roller shafts to receive the substrate on the plurality of conveyance rollers by the plurality of support pillars.

[Configuration 12]

According to the configuration 12, in the substrate conveying apparatus according to any one of the configuration 1 to the configuration 11, the pusher includes a linear movement mechanism configured to linearly move the stage in a horizontal surface.

[Configuration 13]

According to the configuration 13, in the substrate conveying apparatus according to any one of the configuration 1 to the configuration 12, the pusher includes a rotation movement mechanism configured to rotatably move the stage in a horizontal surface.

[Configuration 14]

According to the configuration 14, in the substrate conveying apparatus according to the configuration 12, the pusher includes a linear motion prevention mechanism configured to prevent the linear motion of the stage.

[Configuration 15]

According to the configuration 15, in the substrate conveying apparatus according to the configuration 13, the pusher includes a rotational motion prevention mechanism configured to prevent the rotational motion of the stage.

[Configuration 16]

According to the configuration 16, there is provided a substrate processing apparatus that includes a polishing unit, a cleaning unit, a drying unit, and a conveying unit. The polishing unit is for polishing a substrate. The cleaning unit is for cleaning the substrate. The drying unit is for drying the substrate. The conveying unit is configured to convey the substrate between the polishing unit, the cleaning unit, and the drying unit. The conveying unit includes the substrate conveying apparatus according to any one of the configuration 1 to the configuration 15.

[Configuration 17]

According to the configuration 17, in the substrate processing apparatus according to the configuration 16, the polishing unit includes a table for holding a polishing pad, a table driving mechanism configured to rotatably drive the table, a top ring for holding the substrate, and a pressing mechanism for pressing the substrate held to the top ring against the polishing pad held on the table. The top ring is configured to receive the substrate from the stage of the pusher and hand over the substrate held by the top ring to the stage of the pusher.

[Configuration 18]

According to the configuration 18, in the substrate processing apparatus according to the configuration 17, the polishing unit includes a polishing liquid supply mechanism for supplying a polishing liquid on the polishing pad on the table.

[Configuration 19]

According to the configuration 19, in the substrate processing apparatus according to the configuration 18, the polishing liquid supply mechanism includes a flow passage disposed in the table. The flow passage communicates with opening portions defined in a surface of the table and the polishing pad.

[Configuration 20]

According to the configuration 20, in the substrate processing apparatus according to any one of the configuration 17 to the configuration 19, the top ring includes an air bag. A pressure of a fluid supplied into the air bag makes a pressing force of the substrate against the polishing pad controllable.

[Configuration 21]

According to the configuration 21, in the substrate processing apparatus according to any one of the configuration 17 to the configuration 20, the table has a surface including a silicone layer or a fluorine-based resin layer for facilitating separation of the polishing pad from the table.

[Configuration 22]

According to the configuration 22, in the substrate processing apparatus according to any one of the configuration 17 to the configuration 21, the substrate processing apparatus includes the polishing pad held on the table. The polishing pad has a surface having a groove communicating with an outer periphery of the polishing pad and a groove not communicating with the outer periphery of the polishing pad.

[Configuration 23]

According to the configuration 23, in the substrate processing apparatus according to the configuration 22, the grooves of the polishing pad include grooves defining a concentric pattern and grooves defining a radial pattern.

[Configuration 24]

According to the configuration 24, in the substrate processing apparatus according to the configuration 22, the grooves of the polishing pad include grooves defining a grid pattern.

[Configuration 25]

According to the configuration 25, in the substrate processing apparatus according to any one of the configuration 16 to the configuration 24, the cleaning unit includes a cleaning nozzle for supplying a cleaning liquid to the substrate on the conveyance rollers.

[Configuration 26]

According to the configuration 26, in the substrate processing apparatus according to the configuration 25, the cleaning nozzles are disposed on both of a top surface side and a lower surface side viewed from the substrate on the conveyance rollers.

[Configuration 27]

According to the configuration 27, in the substrate processing apparatus according to any one of the configuration 16 to the configuration 26, the drying unit includes a drying nozzle configured to spray a gas to the substrate on the conveyance rollers.

[Configuration 28]

According to the configuration 28, in the substrate processing apparatus according to the configuration 27, the drying nozzles are disposed on both of a top surface side and a lower surface side viewed from the substrate on the conveyance rollers.

[Configuration 29]

According to the configuration 29, in the substrate processing apparatus according to any one of the configuration 16 to the configuration 28, the substrate processing apparatus includes a housing configured to house at least one of the polishing unit, the cleaning unit, the drying unit, and the conveying unit. The housing includes a window through which an inside is observed from outside. The window includes a light shielding member.

REFERENCE SIGNS LIST

10 . . . pattern area
20 . . . non-pattern area
100 . . . loading unit
200 . . . conveyance unit
202 . . . conveyance roller
204 . . . roller shaft
206 . . . gear
208 . . . motor
210 . . . supporting member
212 . . . guide roller
214 . . . auxiliary roller
216 . . . sensor
218 . . . inlet shutter
220 . . . stopper
222 . . . stopper moving mechanism
230 . . . pusher
231 . . . first elevating mechanism
232 . . . first stage
233 . . . second elevating mechanism
234 . . . support pillar
244 . . . movable pedestal
246 . . . fixed pedestal
249 . . . intermediate plate
250 . . . rotation stage
270 . . . second stage
272 . . . support pillar
280 . . . XY-stopper
282 . . . rotation stopper
284 . . . cleaning nozzle
286 . . . outlet shutter
290 . . . pressing roller
300 . . . polishing unit
302 . . . top ring
306 . . . head body
308 . . . retainer member
310 . . . elastic pad
350 . . . polishing table
352 . . . polishing pad
500 . . . drying unit
506 . . . upper conveyance roller
530 . . . nozzle
600 . . . unloading unit
900 . . . controller
1000 . . . substrate processing apparatus
WF . . . substrate

The invention claimed is:

1. A substrate conveying apparatus for conveying a rectangular substrate, the substrate conveying apparatus comprising:
a plurality of conveyance rollers configured to support a lower surface of the substrate;
a plurality of roller shafts to which the plurality of conveyance rollers are mounted;
a motor configured to rotate the plurality of roller shafts; and
a pusher for lifting the substrate on the plurality of conveyance rollers such that the substrate is separated away from the plurality of conveyance rollers, wherein
the pusher includes a stage configured to pass through a clearance between the plurality of roller shafts,
the pusher is configured to be able to hand over the rectangular substrate to a top ring,
the stage of the pusher includes a plurality of support pillars, and
the plurality of support pillars includes four support pillars, one of each of the four support pillars located at one of four corners of the pusher, and each of the four support pillars includes a support surface for supporting the top ring and an inclined surface for guiding the top ring.

2. The substrate conveying apparatus according to claim 1, comprising
a supporting member disposed between the plurality of conveyance rollers.

3. The substrate conveying apparatus according to claim 1, comprising
a plurality of guide rollers configured to support the substrate in a width direction perpendicular to a conveying direction of the substrate.

4. The substrate conveying apparatus according to claim 1, wherein
the substrate has a non-pattern area not used as a device, and
the plurality of conveyance rollers are arranged to be contactable with the non-pattern area in the substrate.

5. The substrate conveying apparatus according to claim 1, wherein
at least a part of the plurality of conveyance rollers are made of a conductive polymer.

6. The substrate conveying apparatus according to claim 1, further comprising
a magnet gear, wherein
the motor is configured to rotate the roller shafts via the magnet gear.

7. The substrate conveying apparatus according to claim 1, further comprising
a stopper configured to enter a conveyance path of the substrate conveyed on the plurality of conveyance rollers, and to contact the substrate during the conveyance.

8. The substrate conveying apparatus according to claim 1, further comprising
a sensor for sensing presence or absence of the substrate at a predetermined position on the plurality of conveyance rollers.

9. The substrate conveying apparatus according to claim 1, further comprising
a plurality of support rollers configured to support a top surface of the substrate conveyed by the plurality of conveyance rollers.

10. The substrate conveying apparatus according to claim 1, wherein
the motor configured to rotate the plurality of roller shafts is a servomotor.

11. The substrate conveying apparatus according to claim 1, wherein
the pusher includes an elevating mechanism configured to move up and down the stage in an up-down direction, the elevating mechanism is configured to move the stage between an upper position as a position where the stage moves up and a lower position as a position where the stage moves down, and the elevating mechanism is configured such that when the stage moves from the lower position to the upper position, at least a part of the plurality of support pillars of the stage pass through a clearance between the plurality of roller shafts to receive the substrate on the plurality of conveyance rollers by the plurality of support pillars.

12. The substrate conveying apparatus according to claim 1, wherein
the pusher includes a linear movement mechanism configured to linearly move the stage in a horizontal surface.

13. The substrate conveying apparatus according to claim 1, wherein
the pusher includes a rotation movement mechanism configured to rotatably move the stage in a horizontal surface.

14. The substrate conveying apparatus according to claim 12, wherein
the pusher includes a linear motion prevention mechanism configured to prevent the linear motion of the stage.

15. The substrate conveying apparatus according to claim 13, wherein
the pusher includes a rotational motion prevention mechanism configured to prevent the rotational motion of the stage.

16. A substrate processing apparatus comprising:
a polishing unit for polishing a substrate;
a cleaning unit for cleaning the substrate;
a drying unit for drying the substrate; and
a conveying unit configured to convey the substrate between the polishing unit, the cleaning unit, and the drying unit, wherein
the conveying unit includes the substrate conveying apparatus according to claim 1.

17. The substrate processing apparatus according to claim 16, wherein
the polishing unit includes:
a table for holding a polishing pad;
a table driving mechanism configured to rotatably drive the table;
a top ring for holding the substrate; and
a pressing mechanism for pressing the substrate held to the top ring against the polishing pad held on the table, wherein
the top ring is configured to receive the substrate from the stage of the pusher and hand over the substrate held by the top ring to the stage of the pusher.

18. The substrate processing apparatus according to claim 17, wherein
the polishing unit includes a polishing liquid supply mechanism for supplying a polishing liquid on the polishing pad on the table.

19. The substrate processing apparatus according to claim 18, wherein
the polishing liquid supply mechanism includes a flow passage disposed in the table, and the flow passage communicates with opening portions defined in a surface of the table and the polishing pad.

20. The substrate processing apparatus according to claim 17, wherein
the top ring includes an air bag, and a pressure of a fluid supplied into the air bag makes a pressing force of the substrate against the polishing pad controllable.

21. The substrate processing apparatus according to claim 17, wherein
the table has a surface including a silicone layer or a fluorine-based resin layer for facilitating separation of the polishing pad from the table.

22. The substrate processing apparatus according to claim 17, wherein
the substrate processing apparatus includes the polishing pad held on the table, and
the polishing pad has a surface having a groove communicating with an outer periphery of the polishing pad and a groove not communicating with the outer periphery of the polishing pad.

23. The substrate processing apparatus according to claim 22, wherein
the grooves of the polishing pad include grooves defining a concentric pattern and grooves defining a radial pattern.

24. The substrate processing apparatus according to claim 22, wherein
the grooves of the polishing pad include grooves defining a grid pattern.

25. The substrate processing apparatus according to claim 16, wherein
the cleaning unit includes a cleaning nozzle for supplying a cleaning liquid to the substrate on the conveyance rollers.

26. The substrate processing apparatus according to claim 25, wherein
the cleaning nozzles are disposed on both of a top surface side and a lower surface side viewed from the substrate on the conveyance rollers.

27. The substrate processing apparatus according to claim 16, wherein
the drying unit includes a drying nozzle configured to spray a gas to the substrate on the conveyance rollers.

28. The substrate processing apparatus according to claim 27, wherein
the drying nozzles are disposed on both of a top surface side and a lower surface side viewed from the substrate on the conveyance rollers.

29. The substrate processing apparatus according to claim 1, comprising
a housing configured to house at least one of the polishing unit, the cleaning unit, the drying unit, and the conveying unit, the housing including a window through which an inside is observed from outside, the window including a light shielding member.

* * * * *